(12) United States Patent
Park et al.

(10) Patent No.: US 8,785,939 B2
(45) Date of Patent: Jul. 22, 2014

(54) TRANSPARENT AND CONDUCTIVE NANOSTRUCTURE-FILM PIXEL ELECTRODE AND METHOD OF MAKING THE SAME

(75) Inventors: Young-Bae Park, Arcadia, CA (US); George Gruner, Los Angeles, CA (US); Liangbing Hu, Palo Alto, CA (US)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 70 days.

(21) Appl. No.: 11/778,535

(22) Filed: Jul. 16, 2007

(65) Prior Publication Data

US 2008/0157080 A1    Jul. 3, 2008

Related U.S. Application Data

(60) Provisional application No. 60/831,212, filed on Jul. 17, 2006, provisional application No. 60/916,619, filed on May 8, 2007.

(51) Int. Cl.
   *H01L 29/43*    (2006.01)
(52) U.S. Cl.
   USPC  257/72; 257/59; 257/E29.139; 257/E29.151; 257/E27.121
(58) Field of Classification Search
   USPC .............. 257/59, E29.003, 72, E29.139, 257/E29.151, E27.121, E33.064; 977/721
   See application file for complete search history.

(56) References Cited

U.S. PATENT DOCUMENTS

| | | | |
|---|---|---|---|
| 5,777,702 A * | 7/1998 | Wakagi et al. | 349/47 |
| 6,323,490 B1 * | 11/2001 | Ikeda et al. | 250/370.09 |
| 6,988,925 B2 | 1/2006 | Arthur et al. | |
| 2003/0136971 A1 | 7/2003 | Rhee et al. | |
| 2004/0055997 A1 | 3/2004 | Park et al. | |
| 2004/0125300 A1 * | 7/2004 | Lee | 349/141 |
| 2004/0125313 A1 * | 7/2004 | Lim | 349/152 |
| 2004/0218127 A1 * | 11/2004 | Miura | 349/122 |
| 2005/0064091 A1 * | 3/2005 | Yamazaki | 427/58 |
| 2006/0057290 A1 * | 3/2006 | Glatkowski | 427/256 |
| 2006/0138428 A1 * | 6/2006 | Ahn et al. | 257/72 |
| 2007/0154659 A1 | 7/2007 | Yoon | |

FOREIGN PATENT DOCUMENTS

| | | |
|---|---|---|
| JP | 2002-346996 | 12/2002 |
| JP | 2004-302392 | 10/2004 |
| JP | 2005-159143 | 6/2005 |
| JP | 2006-513557 | 4/2006 |
| JP | 2006-171336 | 6/2006 |
| WO | WO 2004/053819 | 6/2004 |
| WO | WO 2004/070821 | 8/2004 |

OTHER PUBLICATIONS

Japanese Office Action dated Apr. 13, 2012 issued in Japanese Application No. 2009-520731.

\* cited by examiner

*Primary Examiner* — Allison P Bernstein
(74) *Attorney, Agent, or Firm* — Harness, Dickey & Pierce, P.L.C.

(57) ABSTRACT

A pixel electrode is provided, with a nanostructure-film deposited over an active matrix substrate, such that the pixel electrode makes electrical contact with an underlying layer. Similarly, auxiliary data pads and auxiliary gate pads are provided, which also have nanostructure-films deposited over an active matrix substrate, such that they make electrical contact with underlying layers.

10 Claims, 26 Drawing Sheets

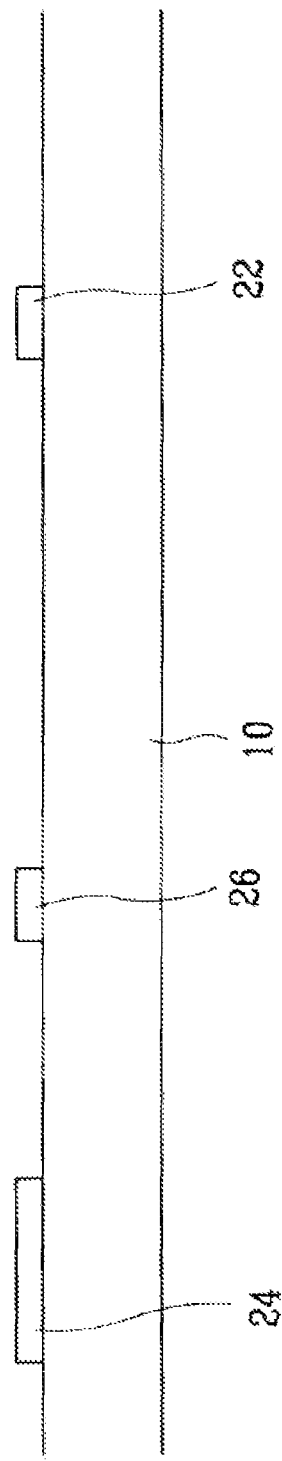

FIG. 16A
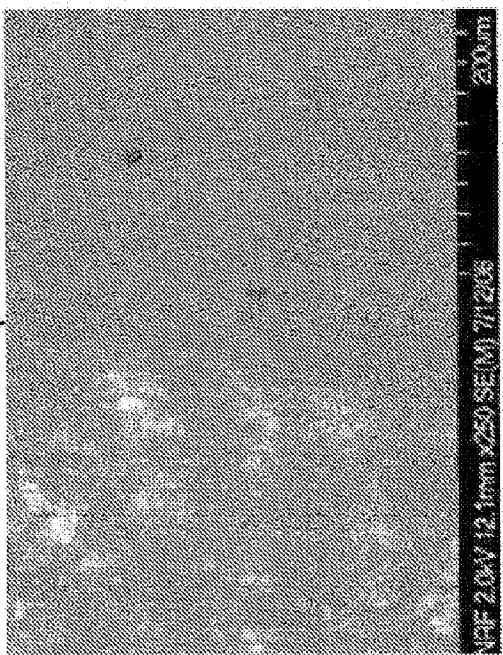
FIG. 16B
FIG. 16C

| 1810 Electrode 1 |
| 1820 Alignment Layer |
| 1830 Spacer Beads & Liquid Crystals |
| 1840 Alignment Layer 2 |
| 1850 Electrode 2 |

FIG. 21A

| 1910 Electrode 1 |
|---|
| 1920 Active layer |
| 1930 Electrode 2 |

FIG. 21B

| 1910 Electrode 1 |
|---|
| 1940 Buffer layer 1 |
| 1920 Active layer |
| 1950 Buffer layer 2 |
| 1930 Electrode 2 |

TRANSPARENT AND CONDUCTIVE NANOSTRUCTURE-FILM PIXEL ELECTRODE AND METHOD OF MAKING THE SAME

This application claims priority to U.S. Provisional Patent Application No. 60/831,212, filed Jul. 17, 2006, and entitled "TRANSPARENT AND CONDUCTIVE NANOTUBE FILM ELECTRODE AND METHOD OF MAKING THE SAME," and U.S. Provisional Patent Application No. 60/916, 619, filed May 8, 2007, and entitled "SIMPLIFICATION OF A THIN FILM TRANSISTOR PROCESS ARCHITECTURE USING NANOSTRUCTURE FILMS," which are hereby incorporated herein by reference.

FIELD OF THE INVENTION

The present invention relates in general to pixelated devices, and more particularly to pixel electrodes comprising at least one nanostructure-film.

BACKGROUND OF THE INVENTION

Pixelated devices have become staples of modern-day living. At present, among the most common of such devices are flat panel displays (e.g., liquid crystal and/or active matrix organic light emitting diode (OLED)), which utilize local pixel electrodes to control individual pixels.

For example, a liquid crystal display (LCD) is structured having liquid crystal material injected between two substrates. When voltages of different potentials are applied to electrodes on the substrates to form electric fields, the alignment of liquid crystal molecules of the liquid crystal material is varied and, accordingly, the transmittance of incident light is controlled to enable the display of images.

More specifically, formed on one of the substrates is wiring, which is electrically connected to each pixel and which defines pixels in a matrix arrangement by transmitting image signals and scanning signals. Pads are connected to ends of this wiring, and are used as a means to transmit the image signals and scanning signals to the wiring from an external drive circuit. To prevent damage to the pads, it is preferable to cover the pads with conductive auxiliary pads. Additionally, in active matrix LCDs, thin film transistors (TFTs) for discontinuing the transmittance of the image signals, and pixel electrodes for transmitting the image signals are formed on this substrate, referred to as a TFT substrate.

In LCDs and many other pixelated device applications, pixel electrodes must be transparent to allow transmission of incident light. Currently, the most common transparent electrode materials are transparent conducting oxides (TCOs), specifically indium-tin-oxide (ITO). Unfortunately, ITO can be an inadequate solution for many device applications (e.g., due to its relatively brittle nature and correspondingly inferior flexibility and abrasion resistance). Additionally, fabrication of ITO components on non-flat surfaces (e.g., TFT substrates) can be extremely challenging with respect to patterning, adhesion and step-coverage. Furthermore, the indium component of ITO is rapidly becoming a scarce commodity, and ITO deposition usually requires expensive, high-temperature sputtering, which can be incompatible with many device processes.

SUMMARY OF THE INVENTION

The present invention provides a nanostructure-film pixel electrode. Nanostructure-films comprising, for example, interconnected networks (e.g., having a density above a percolation threshold) of nanotubes, nanowires, nanoparticles and/or graphene flakes, have attracted a great deal of recent attention due to their exceptional material properties. In particular, transparent conductive nanostructure-films composed of randomly distributed carbon nanotubes (e.g., networks of substantially single-walled nanotubes (SWNTs), double-walled nanotubes (DWNTs) and/or few-walled nanotubes (FWNTs)) have been demonstrated as substantially more mechanically robust than ITO, with potentially comparable electrical properties. Additionally, such nanostructure-films can be deposited using a variety of low-impact methods (e.g., solution-based processes), and comprise carbon, which is one of the most abundant elements on Earth.

According to a further feature of the present invention, the nanostructure-film pixel electrode is deposited on a thin-film-transistor (TFT) substrate (also referred to herein as an active matrix substrate). Transparent, conductive nanostructure-films and pixel electrodes comprised thereof are controllably deposited on such substrates.

According to another feature of the present invention, at least one auxiliary pad is deposited on the TFT substrate, wherein the auxiliary pad comprises a nanostructure-film. This pad is preferably transparent and conductive, and may be formed from the same layer as the pixel electrode.

According to yet another feature of the present invention, the TFT substrate comprises a TFT having a source electrode, a drain electrode and a gate electrode. This TFT is preferably deposited beneath the pixel electrode, and at least one of the electrodes therein preferably comprises a nanostructure-film.

According to an additional feature of the present invention, at least one pixel electrode and/or auxiliary pad is deposited directly on an underlying gate insulating layer. In contrast to the TCOs used in the conventional art, nanostructure films can be deposited using low-impact methods that do not damage underlying gate insulating layers, and thus do not require an intermediate protection layer. Such a structure is advantageous in that it may reduce the number of required mask steps, and thereby the overall device fabrication time and cost. Such a structure may also be advantageous in that the pixel electrode may be formed from the same layer as at least one TFT electrode, thereby reducing contact resistance therebetween.

Other features and advantages of the invention will be apparent from the accompanying drawings and from the detailed description. One or more of the above-disclosed embodiments, in addition to certain alternatives, are provided in further detail below with reference to the attached figures. The invention is not limited to any particular embodiment disclosed.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 8B is a sectional view taken along line VIIIb-VIIIb' of FIG. 8A;

FIGS. 16A, 16B and 16C are SEM images of the nanostructure-film deposited on the first test surface;

FIGS. 21A and 21B are schematic representations of organic light emitting diode (OLED) devices according to additional embodiments of the present invention, comprising at least one nanostructure-film pixel electrode; and Features, elements, and aspects of the invention that are referenced by the same numerals in different figures represent the same, equivalent, or similar features, elements, or aspects in accordance with one or more embodiments of the system.

DETAILED DESCRIPTION OF THE PREFERRED EMBODIMENTS

Figure 1:
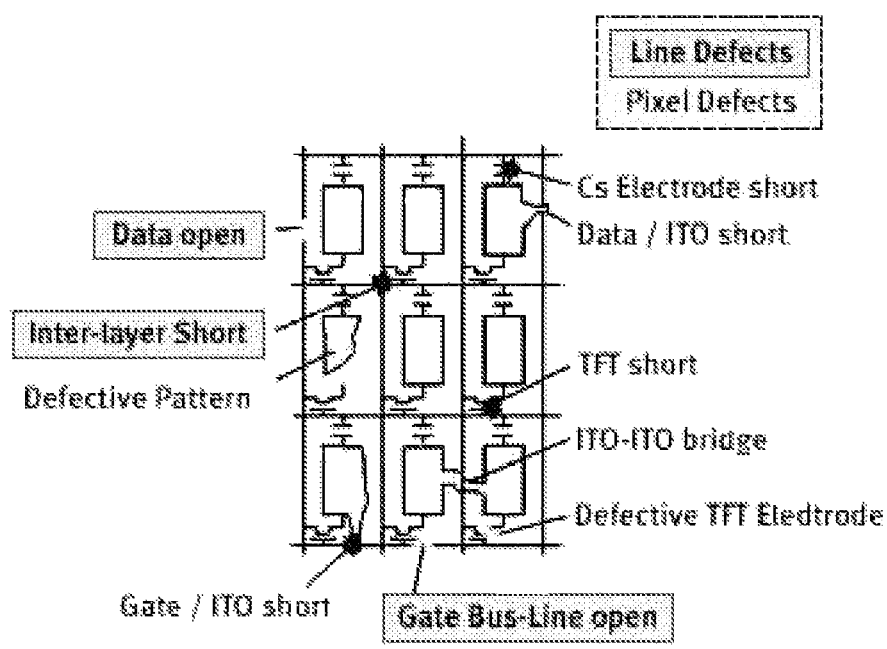
FIG. 1 is a schematic representation of common defects (e.g., line and pixel) that can occur in pixelated devices.

Referring to FIG. 1, fabrication of pixel electrodes on thin-film-transistor (TFT) substrates can be very challenging with respect to patterning. Use of ITO as a transparent electrode material often results in pixel and/or line defects. For example, in the process of manufacturing TFT-LCD panels for LCDs, if a conductive material remains on an unintended portion of the panel (e.g., between adjacent pixel electrodes and/or between the pixel electrodes and the data lines), a pixel defect results from shorting of the pixel electrode(s) with data lines and/or adjacent pixel electrodes.

Additionally, fabrication of pixel electrodes on TFT substrates can be challenging with respect to step coverage. Inadequate step coverage can prevent pixel electrodes from making electrical contact with underlying device layers (e.g., TFT electrodes through narrow vias in insulating protective layers), which in turn leads to dead pixels. ITO transparent electrodes are generally deposited using sputtering, a process typically regarded as having relatively poor step coverage. In order to minimize "dead pixels," manufacturers must often resort to specially-adapted TFT substrates (e.g., with tapered gate electrodes) and/or higher temperature deposition (which can significantly increase ITO processing time).

Similarly, ITO transparent electrodes must generally be sputter-deposited at relatively high temperatures in order to achieve good adhesion with an underlying protective layer, such that the resulting device is suited for more than mere short-term use.

Figure 2:
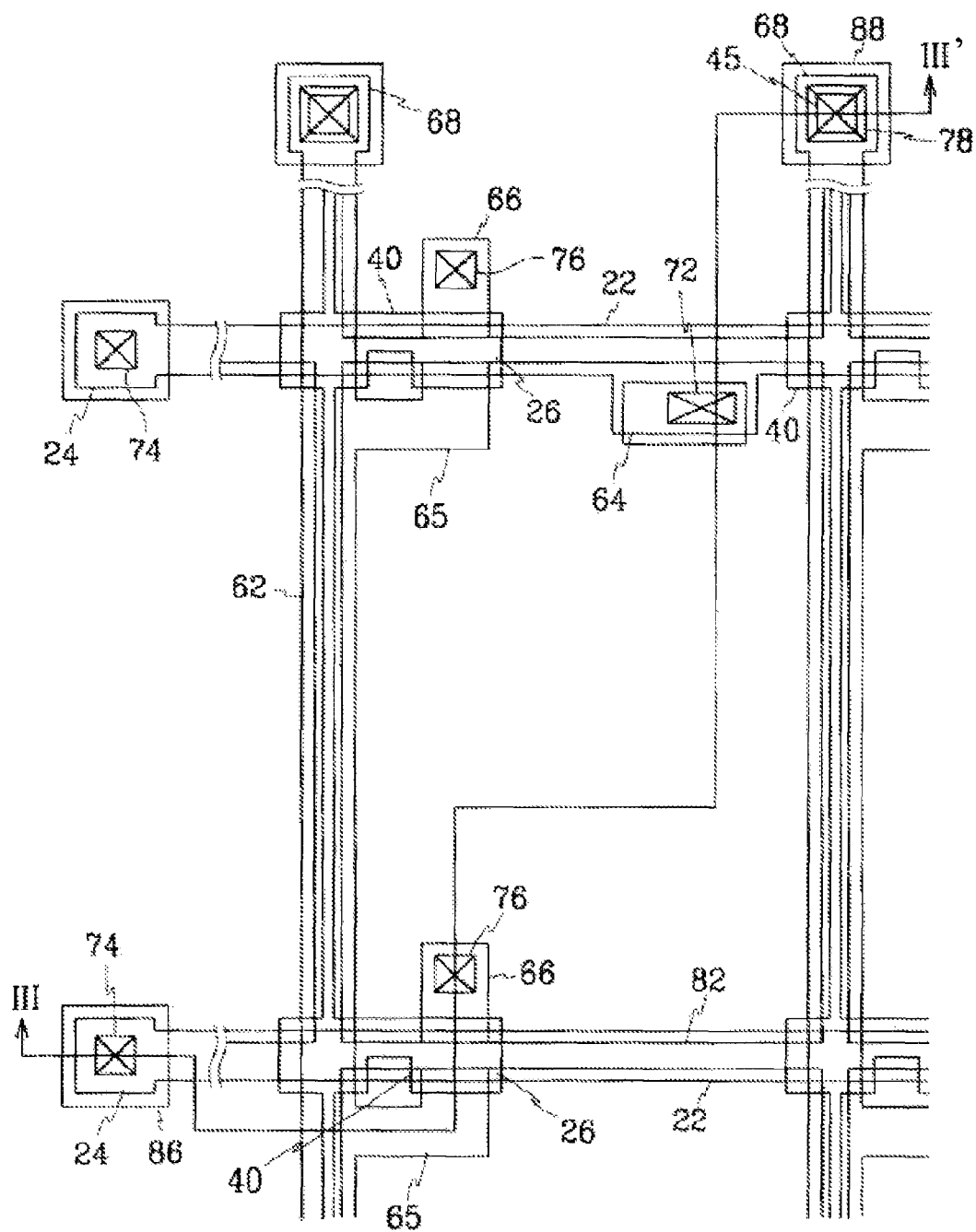
FIG. 2 is a schematic view of a TFT substrate according to a first preferred embodiment of the present invention (note: although the drawings show only a section of the substrate, it is to be assumed that many of the elements described may be formed a plurality of times over the substrate)
Figure 3:
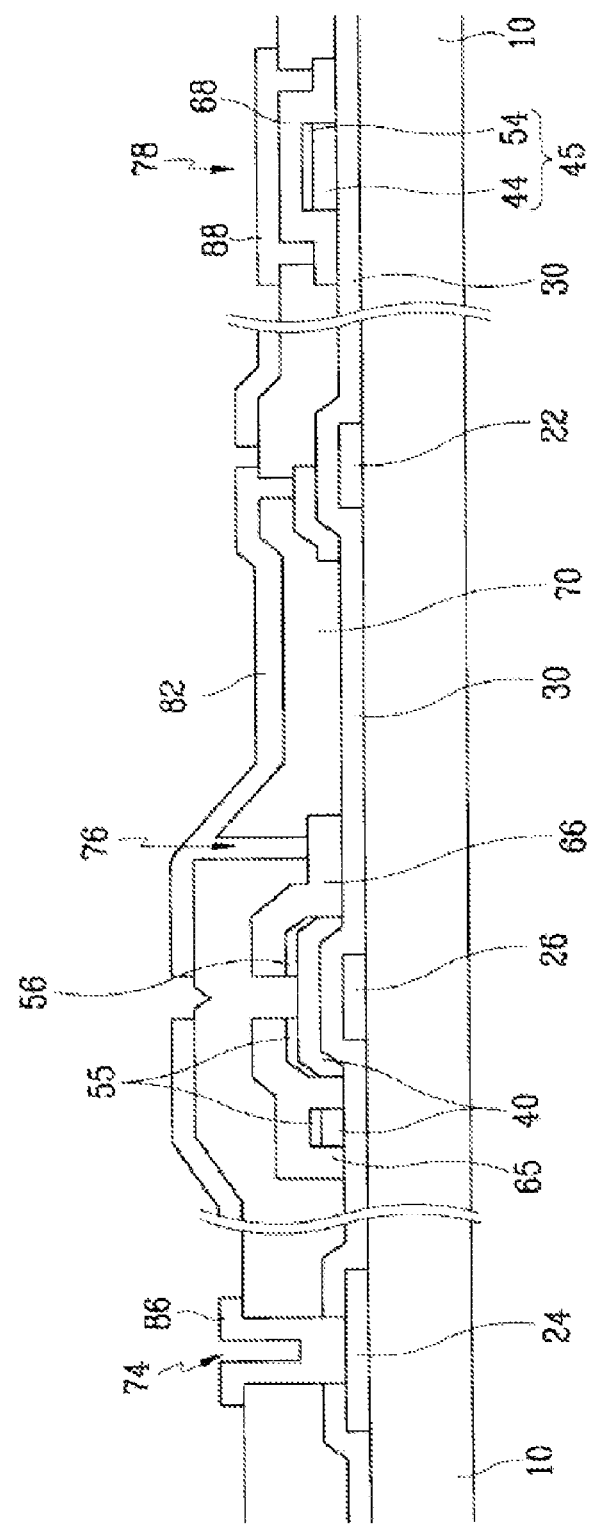
FIG. 3 is a sectional view taken along line III-III' of FIG. 2.

Referring to FIGS. 2 and 3, a pixel electrode according to a first preferred embodiment of the present invention is suitable for active matrix applications. In other words, the pixel electrode can be deposited on a non-flat surface (e.g., TFT substrate), specifically one comprising gate wiring formed on an insulating substrate. The gate wiring may be made, for example, of an aluminum and/or copper group metal having a low resistance, and may comprise gate lines 22 formed horizontally (in FIG. 2) and gate pads 24 connected to ends of the gate lines 22, wherein the gate pads 24 receive gate signals (e.g., from an external drive circuit) and transmit those gate signals to the gate lines 22. The gate wiring may further comprise gate electrodes 26 for thin film transistors, wherein the gate electrodes 26 are connected to the gate lines 22.

A gate insulating layer 30 may cover the gate wiring, and preferably comprises a material such as silicon nitride ($SiN_x$). A semiconductor layer 40 may be formed over the gate insulating layer 30 at areas corresponding to and in the vicinity of the gate electrodes 26, and preferably comprises a semiconductor material such as amorphous silicon. Ohmic contact layers 55 and 56 may be formed over the semiconductor layer 40, and preferably comprise a material such as n+ hydrogenated amorphous silicon (n+ a-Si:H, e.g., doped with n-type impurities at a high concentration). Further, a pad auxiliary layer 45, comprised of amorphous silicon layers 44 and 54, may be formed at predetermined locations over the gate insulation layer 30. The pad auxiliary layer 45 is preferably made on the same layer as the semiconductor layer 40 or the ohmic contact layers 55 and 56.

Data wiring may also be formed over the gate insulation layer 30 and the ohmic contact layers 55 and 56. This data wiring may be made, for example, of a metal such as aluminum (Al) or an aluminum-alloy, copper (Cu) or a copper-alloy, molybdenum (Mo) or a molybdenum-tungsten (MoW) alloy, chrome (Cr), tantalum (Ta), and titanium (Ti). This data wiring preferably comprises data lines 62 formed vertically (in FIG. 2) intersecting the gate lines 22 to thereby define pixels and source electrodes 65 branched from the data lines 62 and extending to cover the ohmic contact layer 55. This data wiring may further comprise drain electrodes 66 separated from source electrodes 65 and formed over the ohmic contact layer 56 on a side opposite the source electrodes 65 with respect to the gate electrodes 26. Also preferably included in the data wiring are data pads 68 connected to one end of the data lines 62 and formed covering the pad auxiliary layer 45, wherein the data pads 68 receive image signals. Where the elements 62, 65, 66 and 68 of the data wiring are formed in two or more layers, it is preferable that one layer is formed of a conducting material (e.g., a low-resistance aluminum group material), and another layer is made of a material that has good contact properties with the first material (e.g., Cr/Al (or an aluminum alloy) or Al/Mo, etc).

A protection layer 70, preferably made of $SiN_x$, may be formed over the data wiring and over portions of the semiconductor layer 40 not covering the data wiring. Contact holes 76 and 78 respectively exposing the drain electrodes 66 and the data pads 68, and a contact hole 74 exposing the gate insulation layer 30 and the gate pads 24 are preferably formed in the protection layer 70. These contact holes 74 and 78, exposing the gate pads 24 and the data pads 68, respectively, can be formed having angles and/or in a circular shape, and preferably have areas between 0.5 mm×15 μm and 2 mm×60 μm. Further, each contact hole 78 is preferably larger than the corresponding pad auxiliary layer 45.

Pixel electrodes 82 are preferably formed on the protection layer 70, such that they are electrically connected to the drain electrodes 66 via the contact hole 76. Further, auxiliary gate pads 86 and auxiliary data pads 88, respectively connecting the gate pads 24 via the contact holes 74 and the data pads 68 via the contact holes 78, may be formed on the protection layer 70. Preferably, at least one of the pixel electrodes 82, auxiliary gate pads and/or auxiliary data pads 86 and 88 comprise nanostructure-films. The pixel electrode preferably has an optical transparency of at least 85% at 550 nm and a corresponding sheet resistance of at least 300 Ω/square.

In preferred embodiments of the present invention, such nanostructure-film components comprise interconnected networks of nanotubes. Such materials have been shown to be substantially more mechanically robust than currently-used indium-tin-oxide (ITO), with potentially comparable electrical properties. Consequently, components composed thereof are not only less prone to failure (e.g., cracking) in current applications, but can also enable novel electronic devices, such as flexible displays based on flexible TFT substrates (e.g., flexible TFTs deposited on flexible substrates). Transparent and flexible nanostructure-film TFTs have been demonstrated in U.S. Non-provisional patent application Ser. No. 10/431,963 entitled "Electronic Sensing of Biomolecular Processes," U.S. Non-provisional patent application Ser. No. 10/582,407 entitled "Active Electronic Devices With Nanowire Composite Components" and U.S. Non-provisional patent application Ser. No. 10/846,072 entitled "Flexible Nanostructure Electronic Devices," which are hereby incorporated herein by reference.

As noted above, step coverage is extremely important for pixel electrodes 82, as they must make electrical contact with corresponding TFTs in order to be switched off and on, and thereby control light transmission. Likewise, step coverage is extremely important for auxiliary gate 86 and data pads 88, which must make electrical contact with corresponding gate and data pads in order to receive and transmit gate and image signals, respectively.

Figure 4:
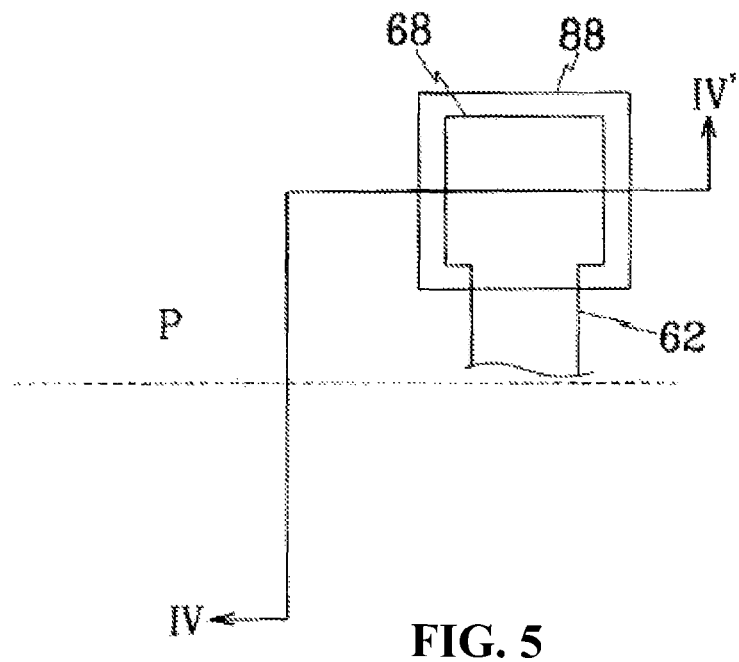
FIG. 4 is a schematic view of a data pad in a TFT substrate according to a second preferred embodiment of the present invention.
Figure 5:
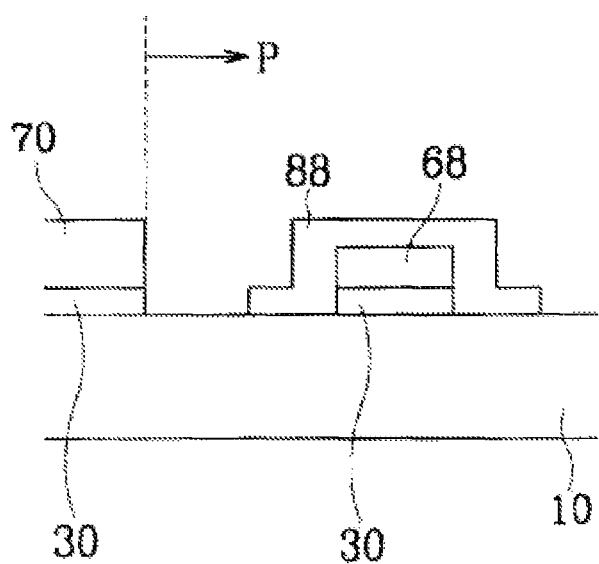
FIG. 5 is a sectional view taken along line IV-IV' of FIG. 4.

Referring to FIGS. 4 and 5, in a second preferred embodiment of the present invention, the gate insulation layer 30 and the protection layer 70 are removed from a specific portion P of the pad portions where the data pads 68 are formed, except for an area under the data pads 68 where the gate insulation layer 30 is left remaining. The auxiliary data pads 88 may fully cover the data pads 68 and extend a predetermined distance over the substrate 10. As a result, the auxiliary data pads 88 may be formed in a protruding manner. This structure can achieve the same results as the first embodiment of the present invention.

Figure 6:
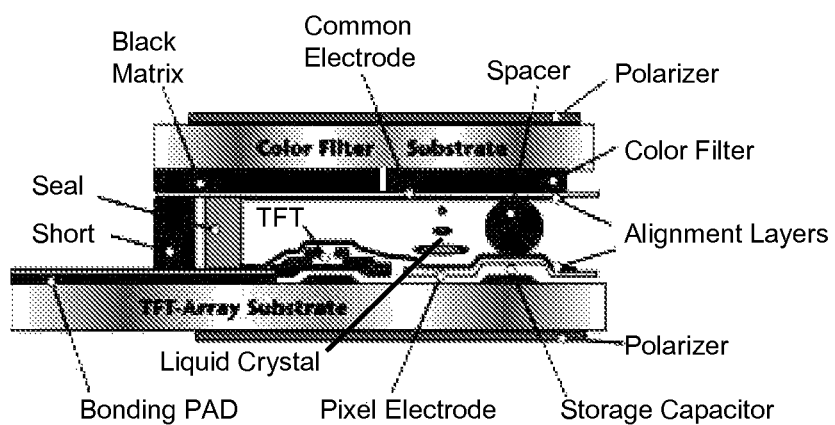
FIG. 6 is a schematic representation of a TFT display device according to embodiments of the present invention.
Figure 7:
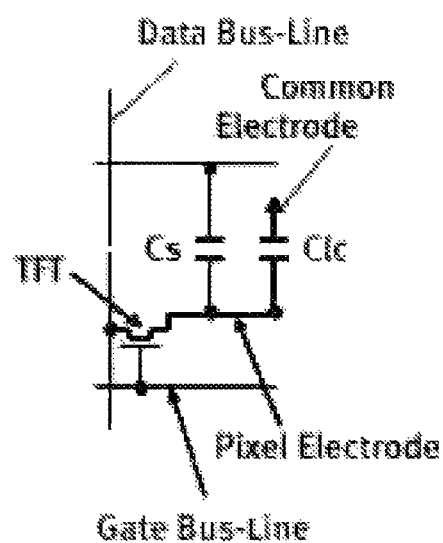
FIG. 7 is a schematic representation of a TFT equivalent circuit according to embodiments of the present invention.

Note, variations in TFT substrate architecture beyond the first and second preferred embodiments may be employed without departing from the scope of the present invention (see FIG. 7 for a general equivalent circuit of TFTs according to embodiments of the present invention). Referring to FIG. 6, TFT substrates are preferably integrated into devices by adding overlying layers. For example, a liquid crystal may be deposited between the pixel electrode and a common electrode, such that signals from an external driving circuit can be used to change the liquid crystal's configuration through the TFT. Further details of such devices are discussed in connection with examples below.

Figure 8A:
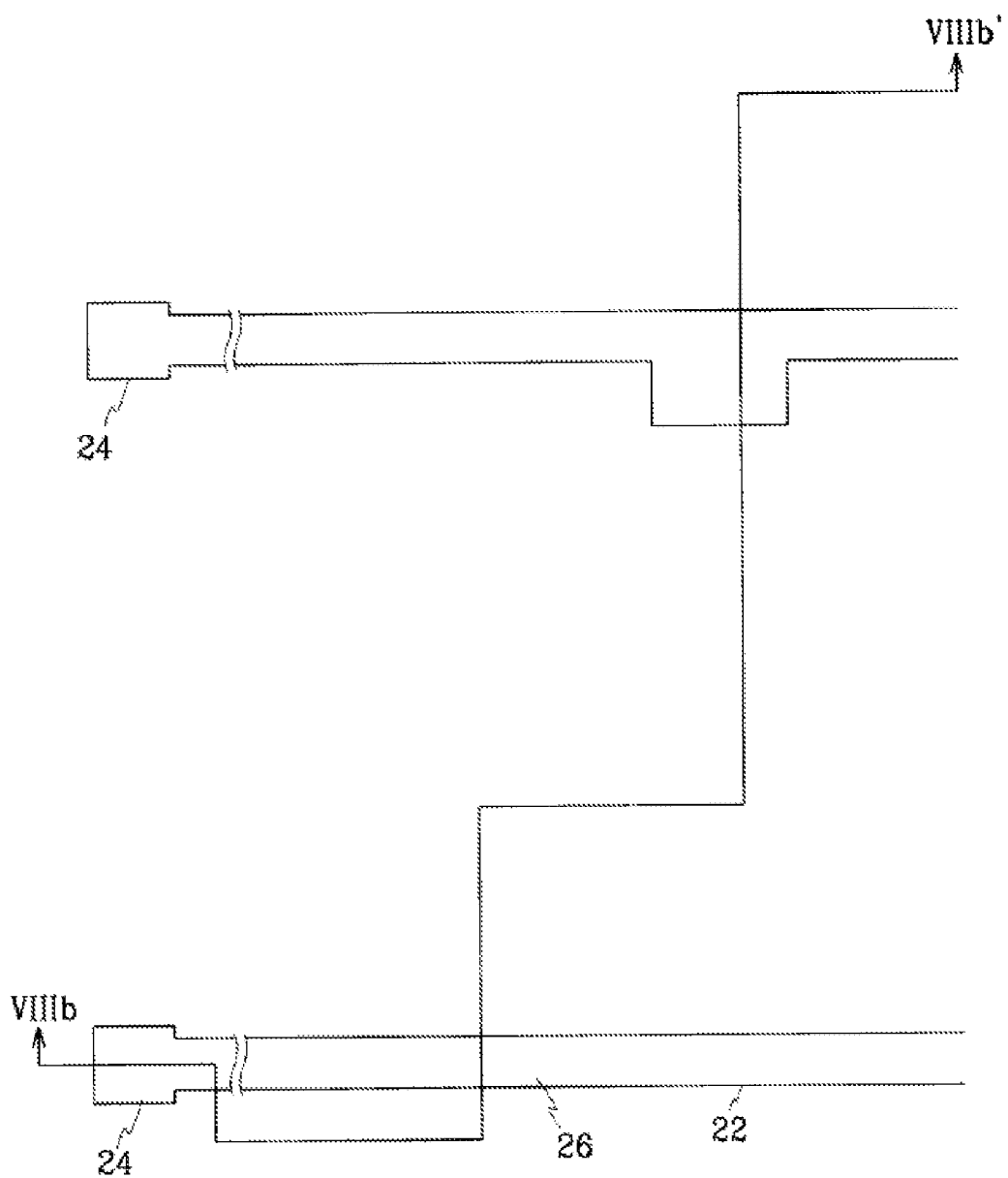
FIGS. 8A, 9A, 10A and 11A are schematic views sequentially illustrating an intermediate process in the manufacturing of a TFT substrate according to a first preferred embodiment of the present invention.

Referring to FIGS. 2, 3, and 8A through 11B, methods for manufacturing the above-described TFT substrate may comprise first forming a layer of a low-resistance aluminum group metal on the substrate 10 (e.g., 1000~3000 Angstroms) (FIGS. 8A and 8B). Such methods may further comprise patterning this layer to form the gate wiring, which includes the gate lines 22, gate electrodes 26 and the gate pads 24.

Figure 9A:
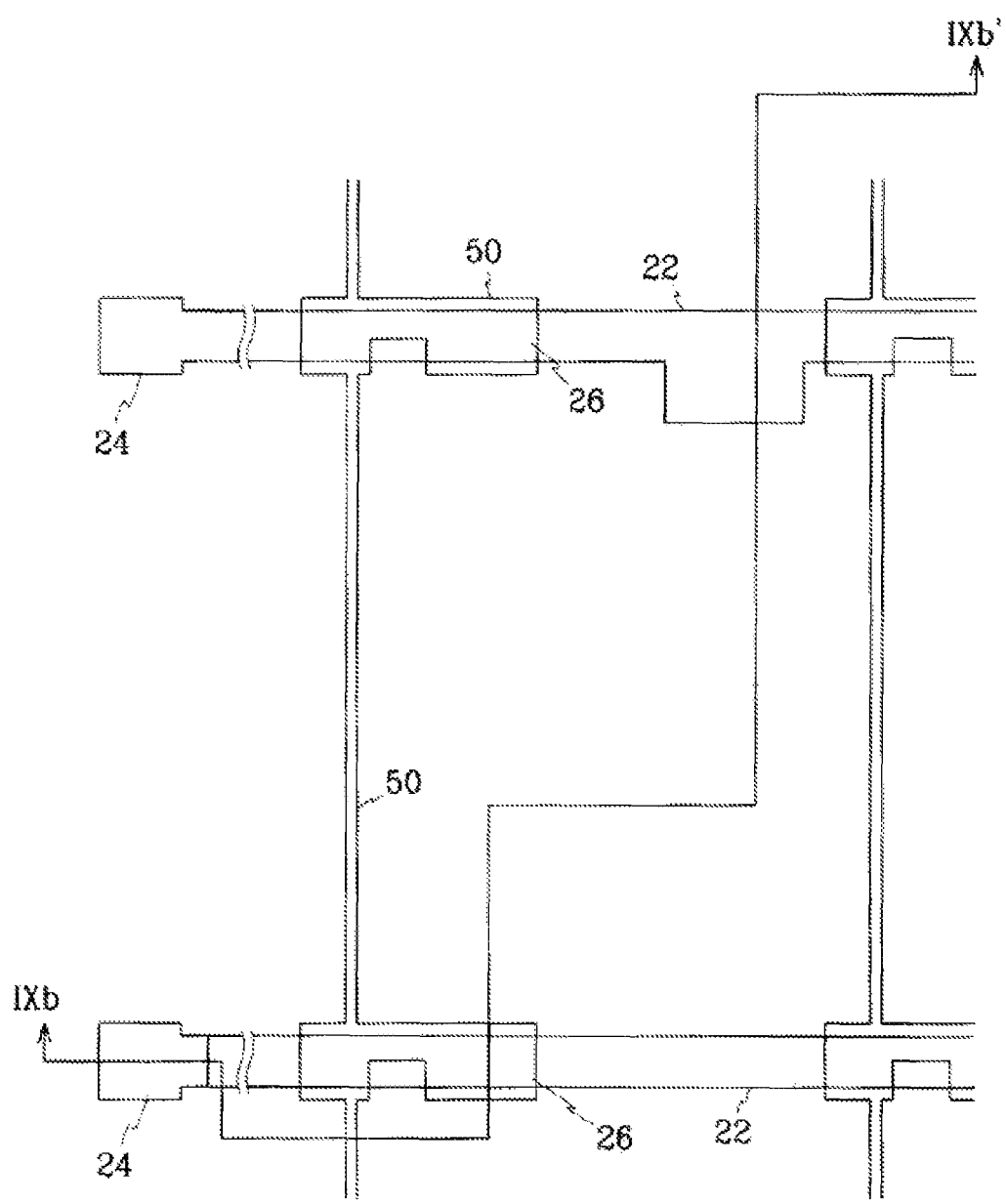
Figure 9B:
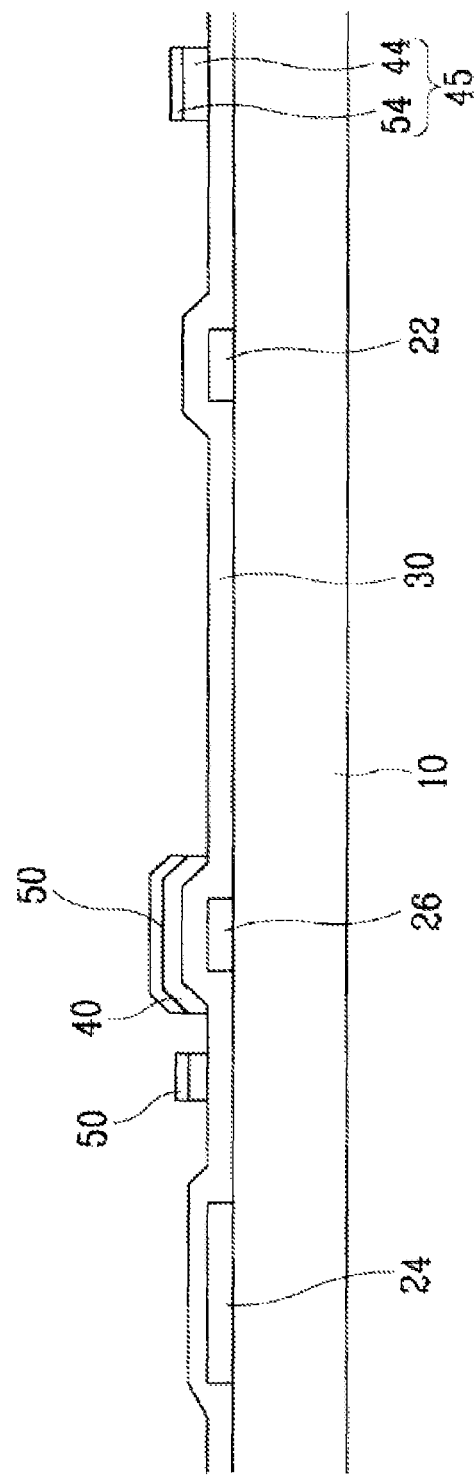
FIG. 9B is a sectional view taken along line IXb-IXb' of FIG. 9A, and it shows a step following that depicted in FIG. 8B.

Once the gate wiring has been patterned, three layers may be deposited on the substrate 10 over the gate wiring: a $SiN_x$ layer, an amorphous silicon layer and a doped amorphous silicon layer (FIGS. 9A and 9B). These three layers may be patterned into the gate insulation layer 30, the semiconductor layer 40 and the doped amorphous silicon layer 50, respectively. The pad auxiliary layer 45, which includes the amorphous silicon layers 44 and 54, may also be formed in this process.

Preferably, the gate insulation layer 30 is deposited at a temperature of at least 300° C. (or at least 100° C. where a polymer substrate is used), such that when forming the gate insulation layer 30 over the gate wiring, a portion or all of an underlying high-resistance $AlO_x$ layer may be removed, and a low-resistance reaction layer, extracted from the aluminum group metal layer, may be formed. Further, a cleaning process using plasma containing oxygen, helium and/or argon is preferably performed in situ before depositing the gate insulation layer 30, in order to prevent the formation of an $AlO_x$ layer on the aluminum group metal layer (i.e., the elements 22, 24 and 26 of the gate wiring).

Figure 10A:
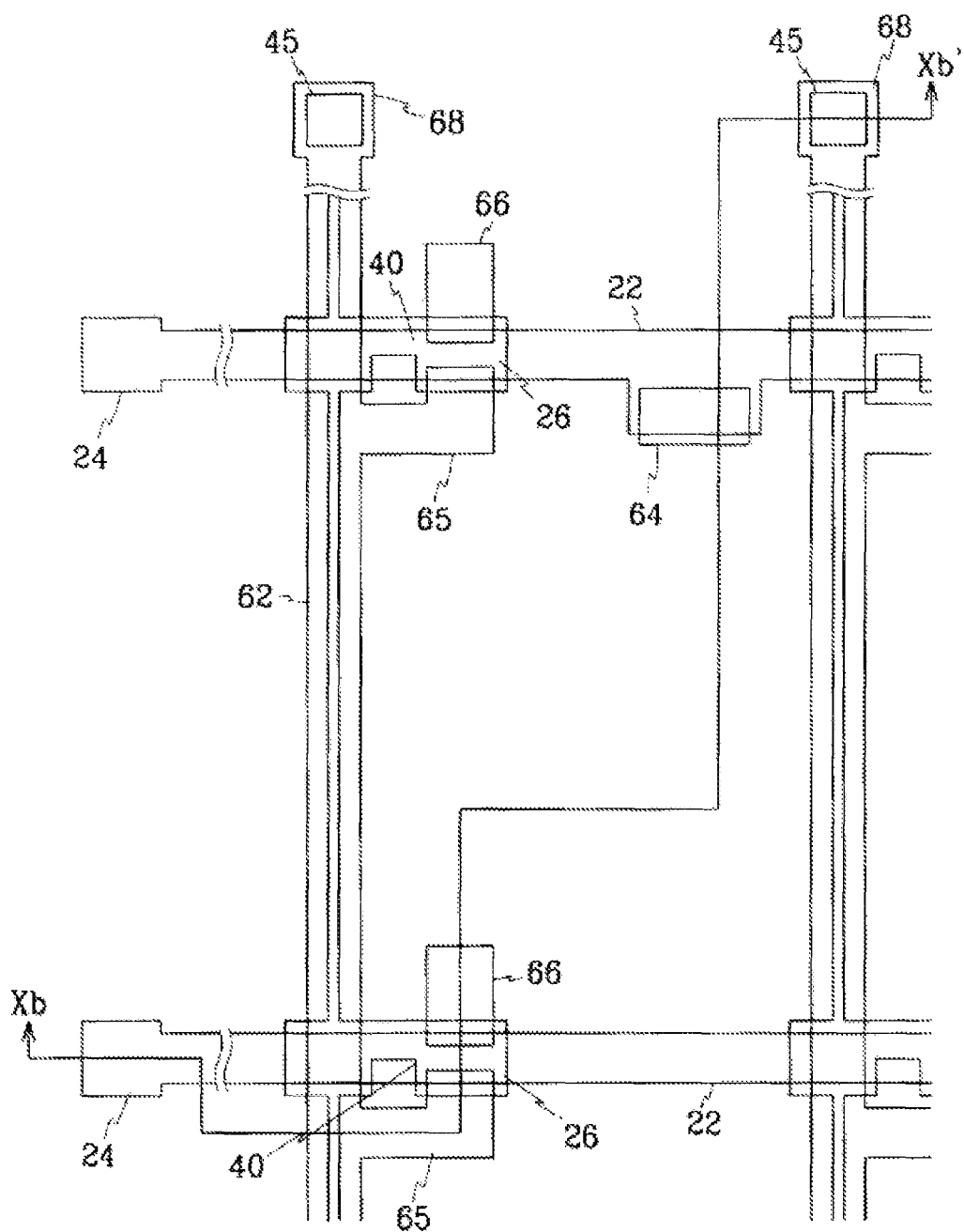
Figure 10B:
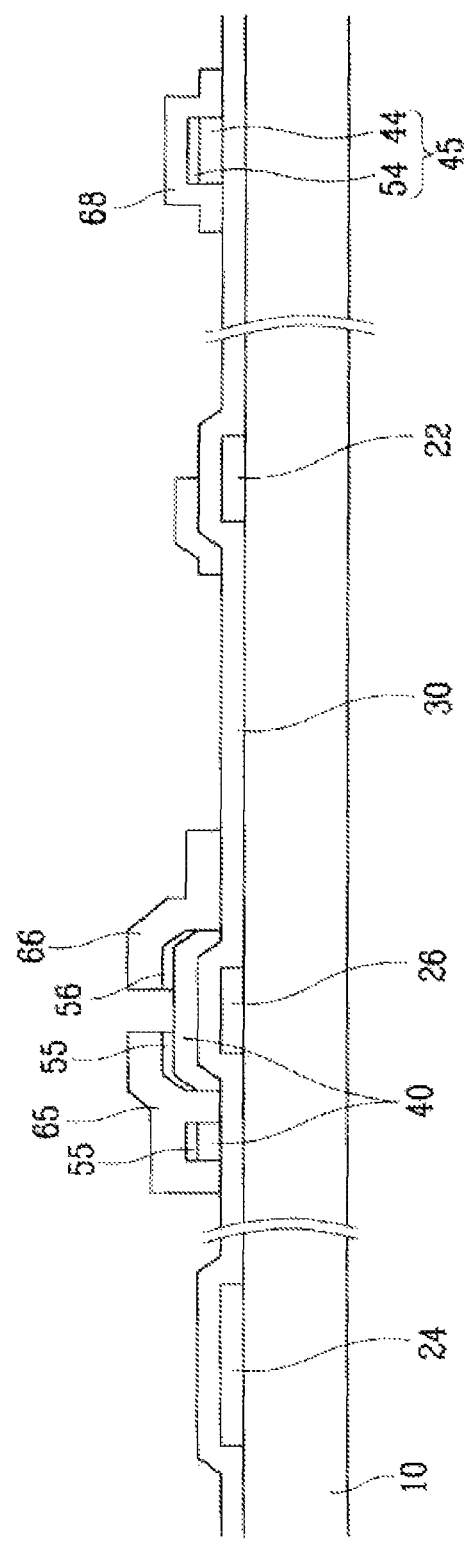
FIG. 10B is a sectional view taken along line Xb-Xb' of FIG. 10A, and shows a step following that depicted in FIG. 9B.

The above processes may be followed by formation of a metal layer (e.g., comprising chrome, molybdenum, a molybdenum alloy, titanium, tantalum, etc.), and photolithography-based patterning to form the data wiring (FIGS. 10A and 10B). In particular, formed in this process are preferably the data lines 62 that cross the gate lines 22, the source electrodes 65 connected to the data lines 62 and extending over the gate electrodes 26, the data pads 68 connected to one end of the data lines 62 and covering the pad auxiliary layer 45, and drain electrodes 66 separated from the source electrodes 65 and located opposite around the gate electrodes 26.

Subsequently, the doped amorphous silicon layer 50 not covering the elements 62, 65, 66 and 68 of the data wiring may be etched to form two portions about the gate electrodes, and to expose the semiconductor pattern 40 between the amorphous silicon layer 40.

Figure 11A:
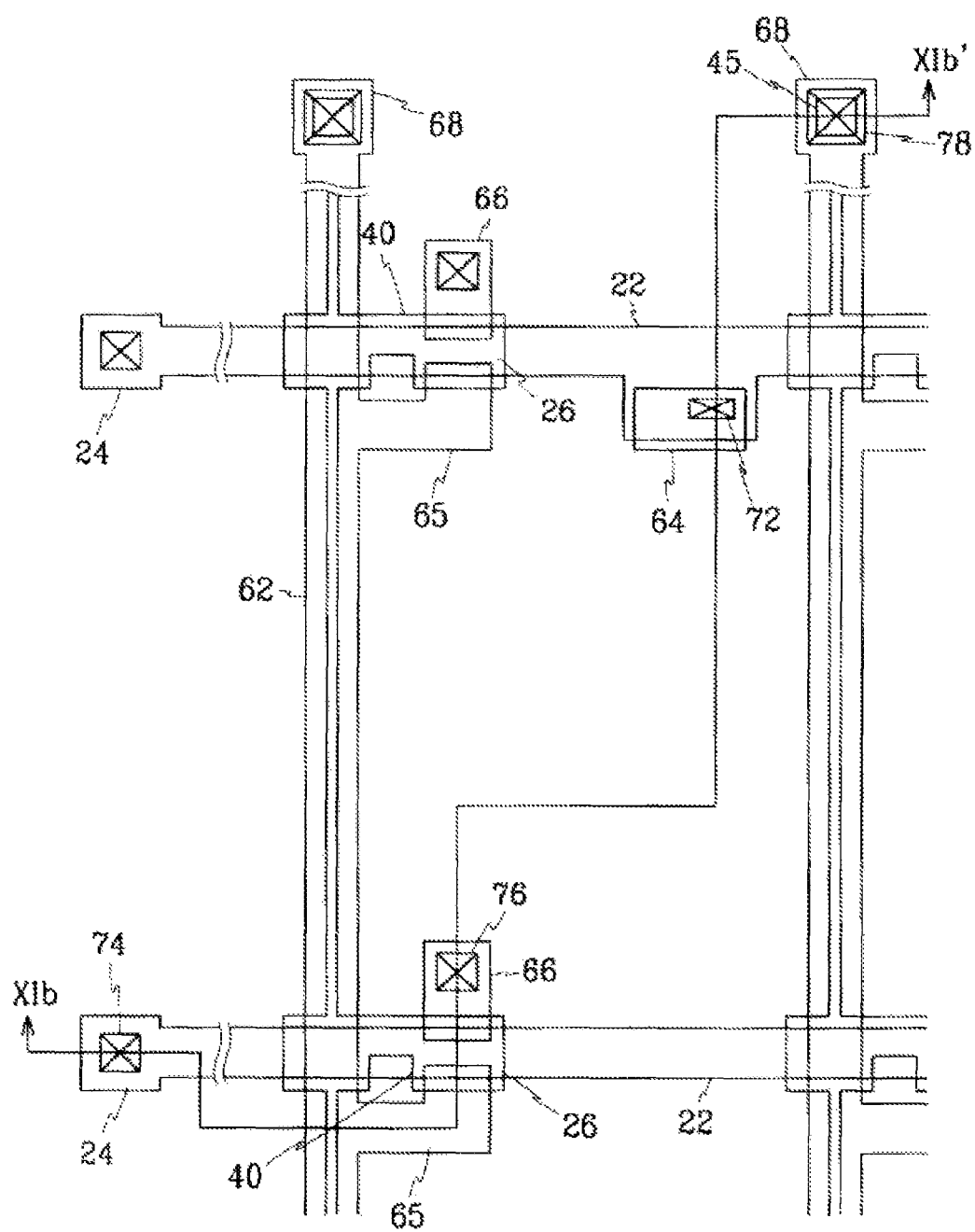
Figure 11B:
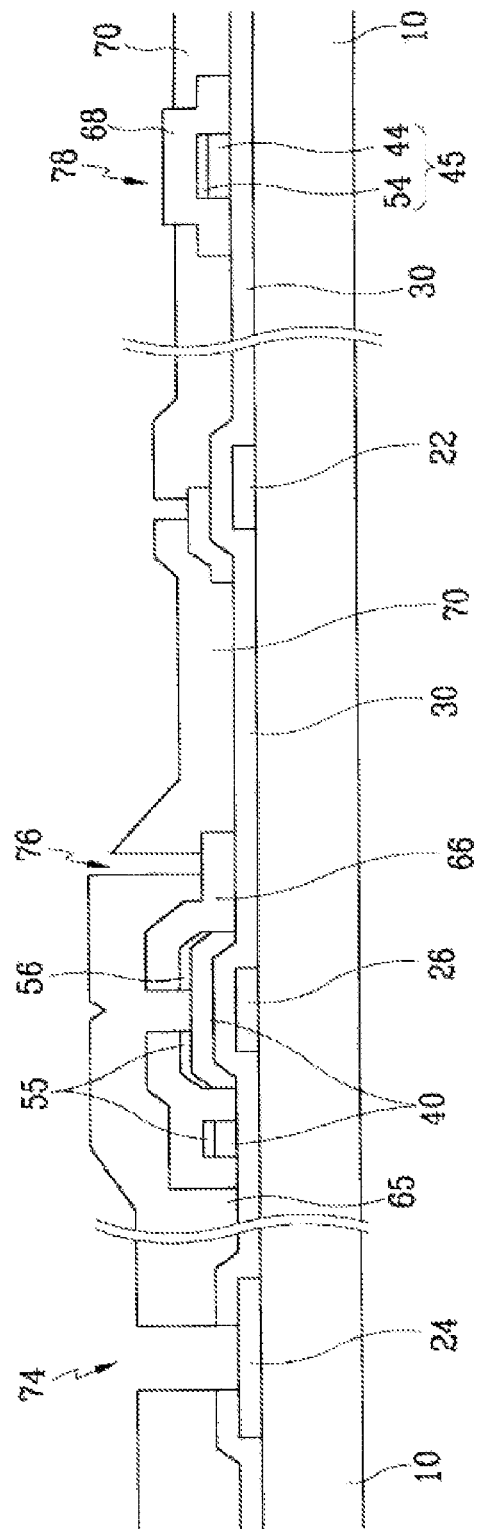
FIG. 11B is a sectional view taken along line XIb-XIb' of FIG. 11A, and shows a step following that depicted in FIG. 10B.
Figure 12A:
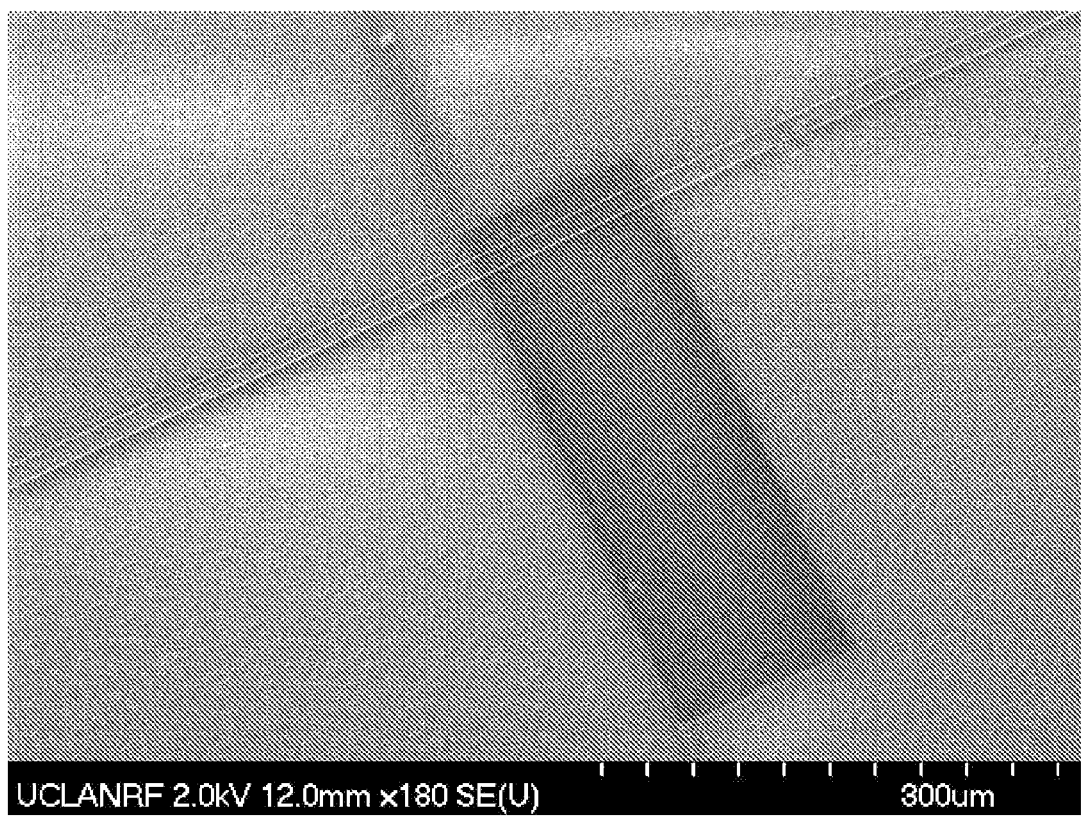
FIG. 12A is a scanning electron microscope (SEM) image of a nanostructure-film pixel electrode according to embodiments of the present invention.
Figure 12B:
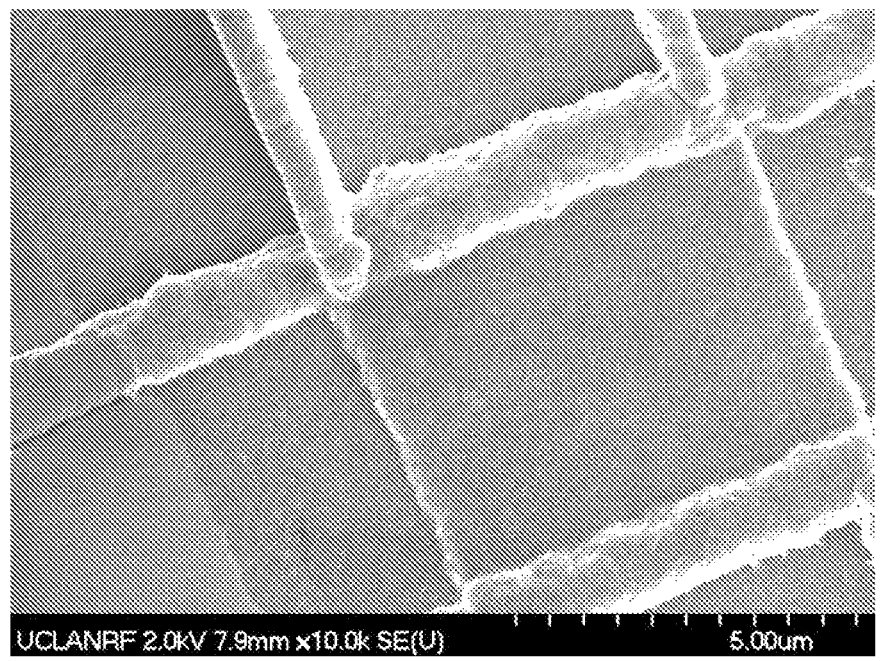
FIGS. 12B and 12C are SEM magnifications of the intersection between the source-drain and the gate lines as shown in FIG. 12A.
Figure 12C:
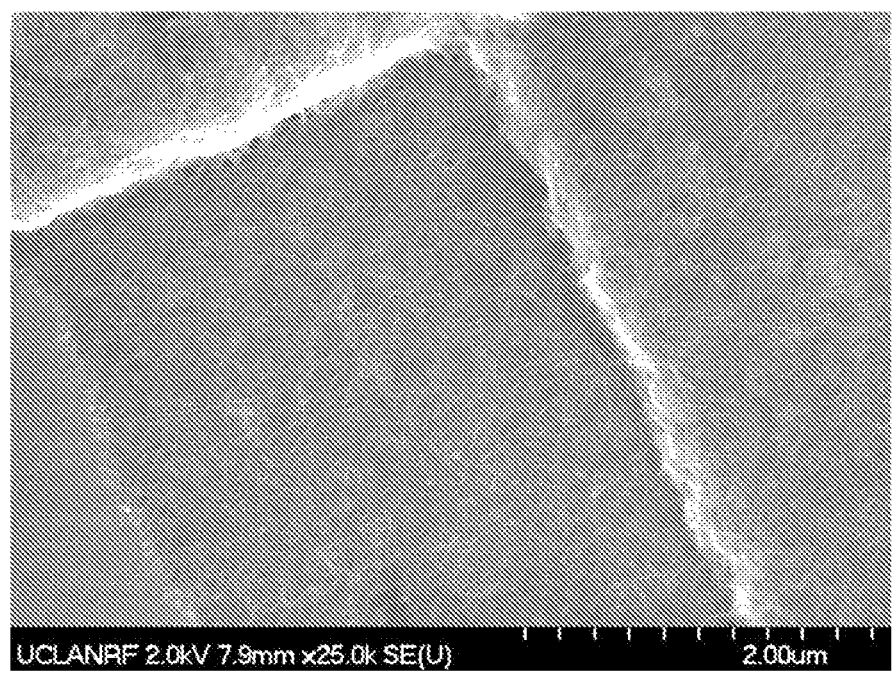
Figure 12D:
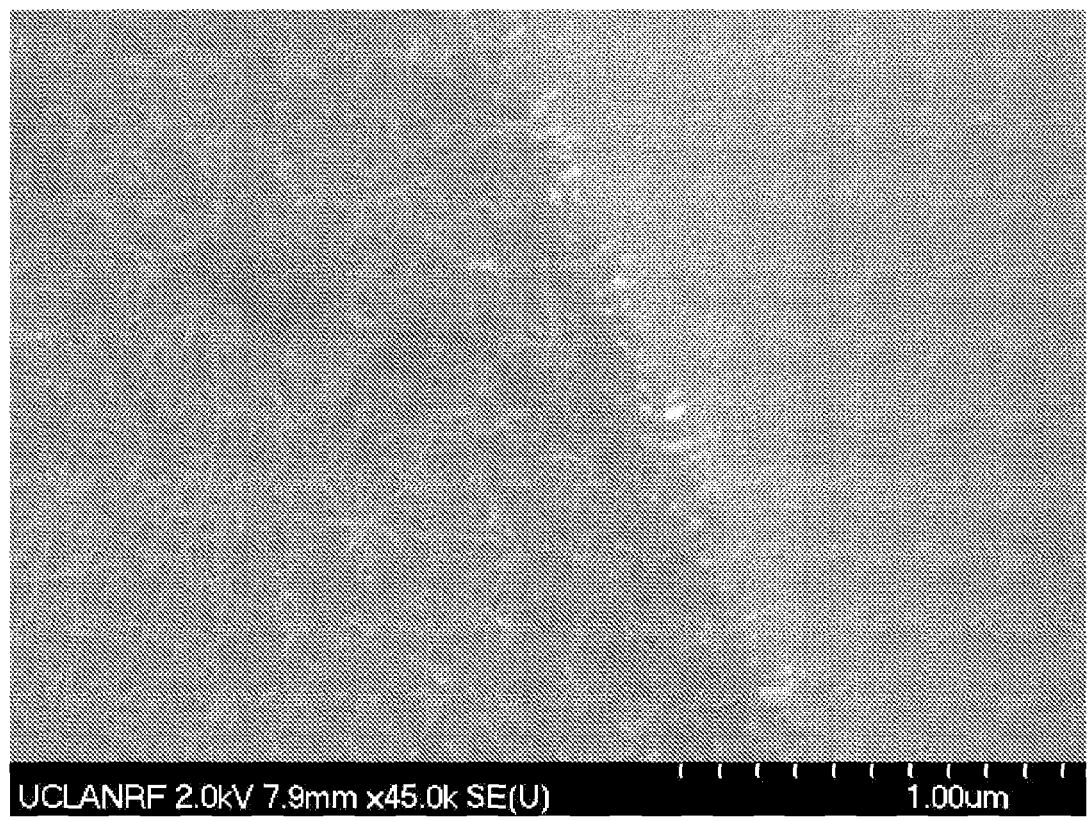
FIG. 12D is an SEM image of an edge of a nanostructure-film pixel electrode according to embodiments of the present invention.

Once the above-described three layers have been deposited and patterned, an inorganic insulation layer may be deposited to form the protection layer 70 (FIGS. 11A and 11B). As with the gate insulation layer 30, the protection layer 70 is preferably deposited over an interval of 5 minutes or more at a temperature of at least 300° C. Subsequent patterning may be used to form contact holes 74, 76 and 78 exposing the gate pads 24, the drain electrodes 66 and the data pads 68, respectively.

To realize the structure of the second preferred embodiment, the protection layer 70 and the gate insulation layer 30 may be removed from the data pad portions.

Finally, with reference to FIGS. 2-8, a nanostructure-film layer may be deposited and patterned to form the pixel electrodes 82, which are preferably connected to the drain electrodes 66 through the contact holes 76, and/or to form the auxiliary gate pads 86 and the auxiliary data pads 88, which are respectively connected to the gate pads 24 through the contact holes 74 and to the data pads 68 through the contact holes 78.

Nanostructure-films according to embodiments of the present invention may be deposited on a TFT substrate using, for example, spray-coating, dip-coating, drop-coating and/or casting, roll-coating, transfer-stamping and/or inkjet printing. Such nanostructure-films may further be patterned before (e.g., transfer stamping), during (e.g., inkjet printing) and/or after (e.g., photolithography, etching and/or liftoff) deposition. Additionally, a polymer material may be deposited beneath, on top of or as a composite with the nanostructure-film (e.g., a binder, functionalization and/or encapsulation layer). Applicable encapsulants according to embodiments of the present invention include, but are not limited to, a fluoropolymer, acrylic, silane, polyimide and/or polyester encapsulant (e.g., PVDF (Hylar CN, Solvay), Teflon AF, Polyvinyl fluoride (PVF), Polychlorotrifluoroethylene (PCTFE), Polyvinylalkyl vinyl ether, Fluoropolymer dispersion from Dupont (TE 7224), Melamine/Acrylic blends, conformal acrylic coating dispersion, etc.).

As mentioned above, fabrication of pixel electrodes 82, auxiliary gate pads 86 and/or auxiliary data pads 88 is complicated by the fact that such structures must generally be deposited over non-flat surfaces (e.g., vias and/or TFTs). Step coverage is particularly important in the context of active matrix devices, wherein such structures must be in electrical contact with underlying device layers (e.g., drain electrodes 66, gate pads 24 and data pads 68), generally through narrow vias. It is believed that transparent conductive nanostructure-films have not previously been controllably deposited on such non-flat surfaces.

Referring to FIGS. 2, 12A, 12B, 12C and 12D, a nanostructure-film pixel electrode 82 according to embodiments of the present invention was deposited and patterned adjacent to overlapping source-drain 65, 66 and gate 26 electrode lines (i.e., over contact hole 76). As can be seen from FIG. 12D, magnification of the pixel electrode border evidences the successful patterning of the nanostructure-film. Cleanly patterned lines are important, given the potential formation of aforementioned pixel and line defects (see FIG. 1).

Figure 13A:
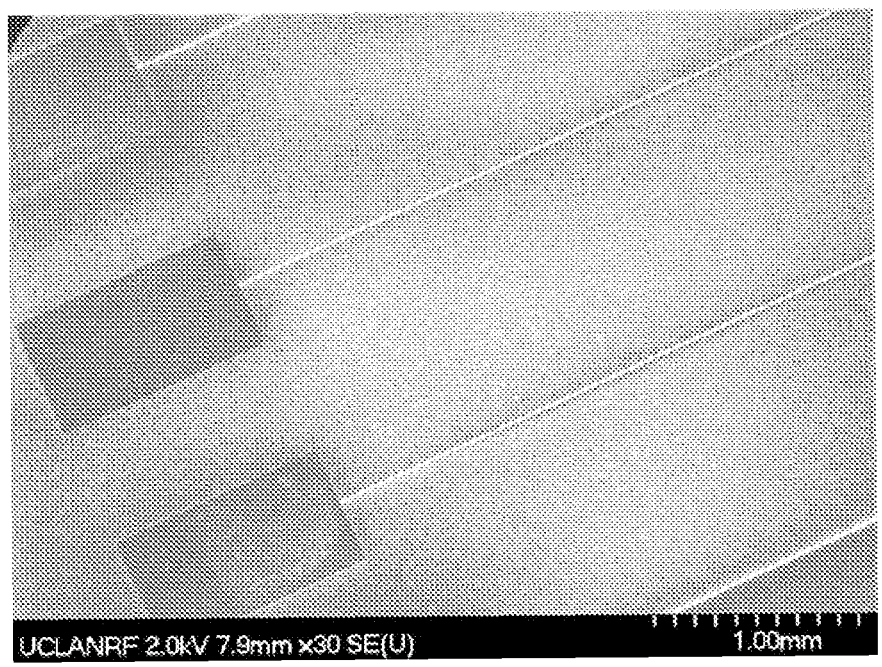
FIGS. 13A and 13B are SEM images of a nanostructure-film auxiliary date pad according to further embodiments of the present invention.
Figure 13B:
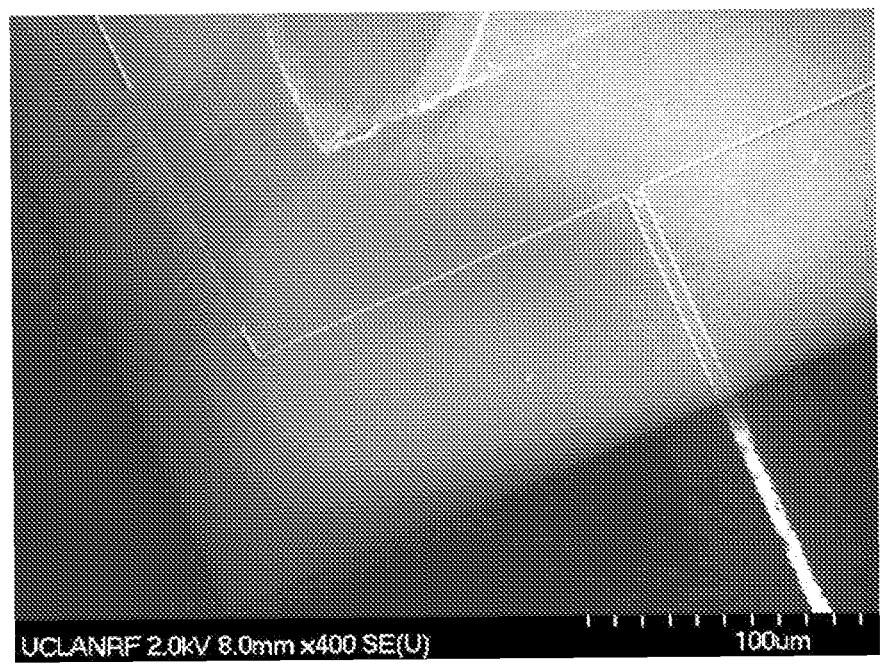

Similarly, referring to FIGS. 13A and 13B, nanostructure-film auxiliary gate pads 86 according to further embodiments of the present invention were deposited over gate pads 24. As with the pixel electrodes 82, the auxiliary gate pads displayed successful nanostructure-film patterning. Moreover, FIG. 13B demonstrates successful nanostructure-film step coverage, wherein the nanostructure-film can be seen covering the contact hole step and contacting the underlying gate pad. The height of this step (i.e., the thickness of the $SiN_x$ protective layer) is ~300 nm, and is characteristic of most of the contact holes and vias on the fabricated TFT substrate.

Nanostructure-film components, as depicted in FIGS. 12A, 12B, 13A and 13B, were fabricated using dip-coating and dry etching processes. Specifically, a test TFT substrate was dipped into a nanostructure solution (e.g., comprising P3 arc-discharged single-walled nanotubes (SWNTs) from Carbon Solutions, Inc. dissolved in deionized (DI) water with a Triton-X surfactant), the former having been pre-treated (e.g., soaked in 1% silane solution) such that a thin layer of nanostructure solution coated the substrate surface upon dipping. Solvent was subsequently evaporated from the solution by passing the coated substrate over a hot plate. Additionally, solvent evaporation was aided by air-flow blow drying. The substrate was then washed (e.g., with DI water) to remove surfactant from the nanostructure-film, and then dried with air-flow blow drying and heat.

This nanostructure-film was thereafter patterned by first depositing (e.g., spin-coating) and patterning (e.g., by photolithography) a layer of resist over the nanostructure-film, and then dry etching exposed portions of the nanostructure-film (e.g., using a Reactive Ion Etcher (RIE) and argon (AR) plasma). Whereas inert gases are used in dry etching generally only as dilutants (i.e., rather than etchants, since they do not react significantly with most integrated-circuit (IC) materials), as employed in the present invention such gases (e.g., Ar, He, Ne, Xe) can be employed as effective etch gases (e.g., for carbon), and are advantageous over many other dry etching gases in that they allow high selectivity control between, for example, nanotubes and passivation materials (e.g. silicon nitride (SiNx:H), silicon dioxide ($SiO_2$), amorphous silicon (a-Si:) and poly-silicon (poly-Si)).

When Triton-X is used as a surfactant in nanostructure-film deposition, substrate pre-treatment is generally unnecessary (e.g., for nanotubes on glass or polyethylene (PET)). However, in early experiments, nanostructure-films failed to demonstrate adequate adhesion to the $SiN_x$ passivation surface of the TFT substrate and would wash off during the surfactant removal stage. It was eventually found that silane pre-treatment of the $SiN_x$ surface solved this problem by increasing the surface energy of the $SiN_x$. Plasma pre-treatment was likewise shown to be relatively effective.

EXAMPLE

Variable Thickness Nanostructure-Film

In further embodiments of the present invention, the nanostructure-film layer may be formed with differing thicknesses over different portions of the device substrate. Such fabrication may be accomplished by selective nanostructure deposition and/or patterning techniques.

Figure 14A:
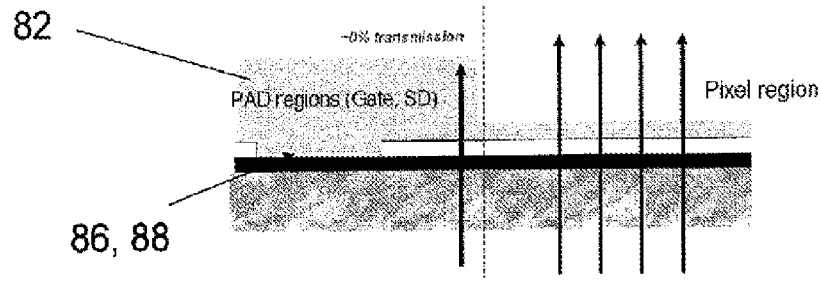
FIG. 14A is a schematic representation of a variable-thickness nanostructure-film according to another embodiment of the present invention.

For example, referring to FIGS. 2 and 14A, a nanostructure-film 82, 86 forming a TFT pixel electrode, as described above, may comprise thicker portions formed over certain areas (e.g., contact holes to a TFT electrode 76 and/or pad 74)

where transparency is not necessarily required given that underlying components (e.g., TFT electrodes, gate pads) are often not transparent, while the thinner portion may be formed on a protective layer 70 in the pixel area, wherein transparency is of utmost importance. Such variable thickness can allow for margins of error in ensuring that adequate contact is made through contact holes and/or adequate optical transparency is maintained in pixels.

Figure 14B:
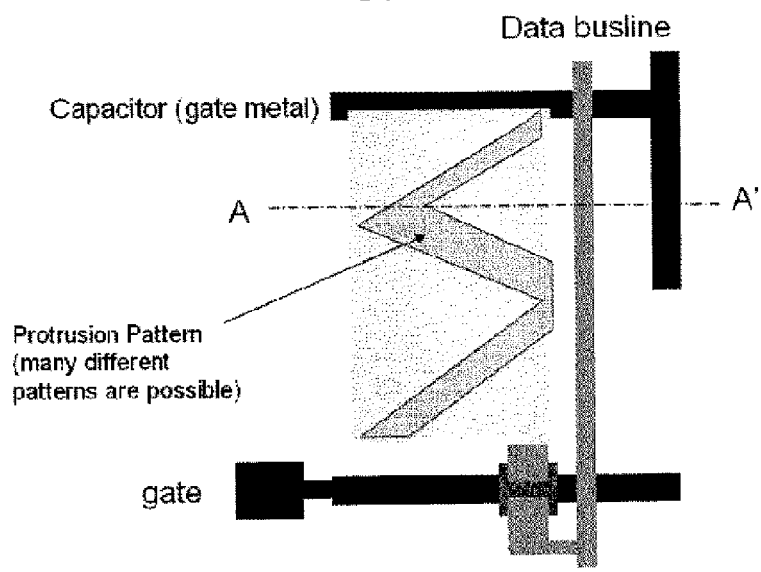
FIG. 14B is a schematic representation of a vertical alignment (VA) mode LCD pixel electrode and protrusion pattern according to yet another embodiment of the present invention.

Similarly, referring to FIG. 14B, such variable-thickness nanostructure-film may be used in vertical alignment (VA) mode LCDs. For example, protrusion regions in such devices may undergo more deposition cycles than the rest of the pixel region (e.g., through masking and/or patterned stamps). Additionally or alternatively, the protrusion region of a thick pixel electrode film may be masked while the rest of the pixel electrode is etched. Protrusions on the color filter substrate and/or panel may likewise be formed from a nanostructure-film.

Figure 14C:
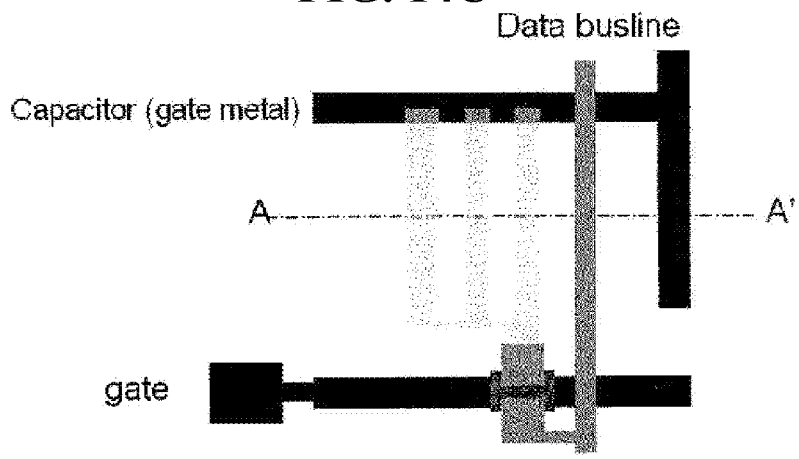
FIG. 14C is a schematic representation of an in-plane switching (IPS) mode LCD pixel electrode (e.g., transparent finger electrodes) according to still another embodiment of the present invention.

Additionally, referring to FIG. 14C, in in-plane switching (IPS) LCD mode (e.g., structure described in U.S. Pat. No. 5,598,285, incorporated herein by reference in its entirety), opaque SD metal can be replaced with nanostructure-film pixel electrodes according to embodiments of the present invention. Such electrodes can improve transmittance of pixel aperture area and reduce power consumption, due to decreased backlight current requirements.

EXAMPLE

Test Surface 1—Spraying Method

According to another, non-limiting exemplary embodiment of the present invention, a transparent conductive nanostructure-film comprising an interconnected network of nanotubes was deposited over a non-flat test surface by a spraying method.

Figure 15A:
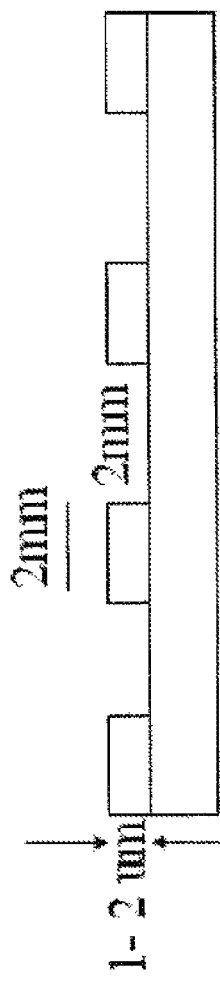
FIGS. 15A and 15B are schematic views of a first test surface used to demonstrate step coverage, adhesion and patterning of a nanostructure-film deposited using a spray method.
Figure 15B:
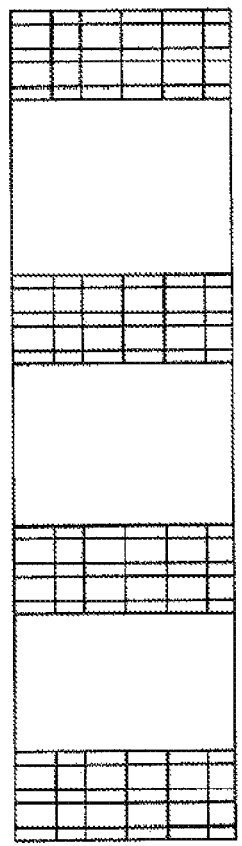
Figure 15B:
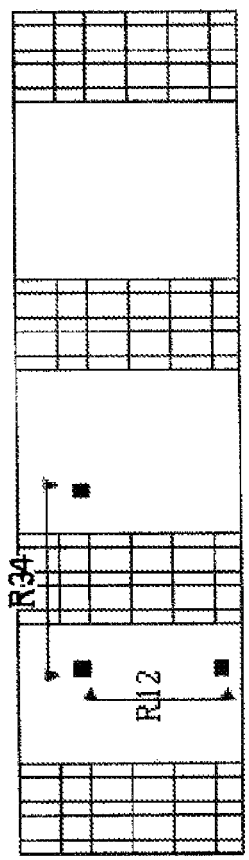

Referring to FIGS. 15A and 15B, a test surface was first fabricated from photoresist on a glass substrate, such that the test surface comprised 1-2 micron high, 2 mm wide photoresist steps with 2 mm separations. This surface was then pre-treated with silane (e.g., vapor or 1% aqueous solution), while commercially-available SWNT powder was dissolved in solvent (e.g., water) with surfactant (e.g., 1% sodium dodecyl sulfate (SDS)), sonicated and centrifuged. The resulting SWNT solution was spray-deposited onto the pre-treated surface (e.g., over a hot plate), which was subsequently washed (e.g., immersed in room temperature DI water) to remove surfactant. Such spray and wash cycles may be repeated until desired film properties (e.g., sheet resistance and optical transparency) are achieved.

Referring to FIGS. 16A-C, the nanostructure films produced by spraying according to the exemplary method described above displayed good step coverage, with over 80% transparency in the visible and UV wavelength ranges, and corresponding sheet resistances of about 1300 ohms between the substrate steps R12, and about 1300 ohms in the area over a substrate step R34. Conductivity was evaluated to be over 1000 S/cm using the method described in Hu L. B.; Hecht D. S.; Grüner G. *Nano Lett.* 2004, 4, 2513, incorporated herein by reference.

Spray-deposition methods according to further embodiments of the present invention may comprise spraying a substrate from multiple angles (e.g. using moving and/or a plurality of nozzles) to achieve better step coverage. Additionally or alternatively, spray methods according to embodiments of the present invention may be scaled-up using a roll-to-roll apparatus. As compared to a batch process, which handles only one component at a time, a roll-to-roll process represents a dramatic deviation from current manufacturing practices, and can reduce capital equipment and display part costs, while significantly increasing throughput.

For example, a flexible sheet substrate (e.g., comprising a polymer such as PET) may be wound or spooled from a source roll to a take-up roll, such that the moving substrate passes adjacent to nozzles, which deposit nanostructure suspension on the substrate. The nozzles may be oriented at different angles to each other and/or the substrate may be directed at different angles below or adjacent to different nozzles to better cover the stepped areas. If desired, the substrate may be also passed through a DI and/or methanol water bath between adjacent nozzles. Intermediate rolls or motors may be used to guide the substrate or web through the tanks and between the nozzles. The rolls or motors adjacent to the nozzles may be heated (i.e., "hot motors") to a temperature of above 100° C., such that the nanostructure-film is deposited on a heated portion of the moving substrate. Additionally or alternatively, the substrate may be heated using heat lamps and/or thermal heaters in the deposition areas.

EXAMPLE

Test Surface 2—Stamping/Printing Method

According to another specific, non-limiting exemplary embodiment of the present invention, a transparent conductive nanostructure-film comprising an interconnected network of nanotubes was deposited over a second non-flat test surface using a stamping method (alternatively referred to as "printing").

Figure 17A:
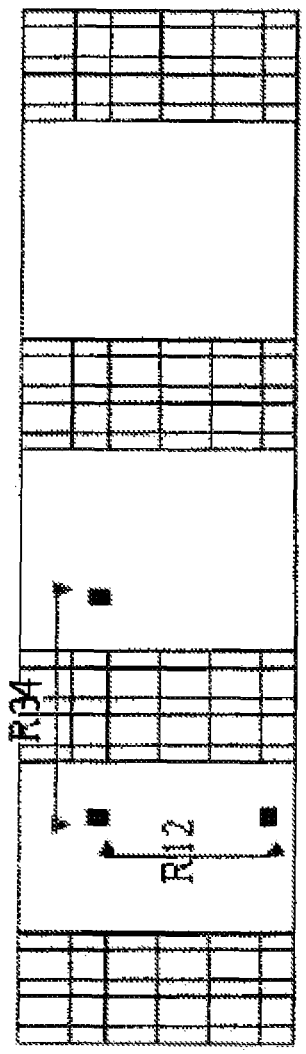
FIGS. 17A and 17B are schematic views of a second test surface used to demonstrate step coverage, adhesion and patterning of a nanostructure-film deposited using a printing method.
Figure 17B:
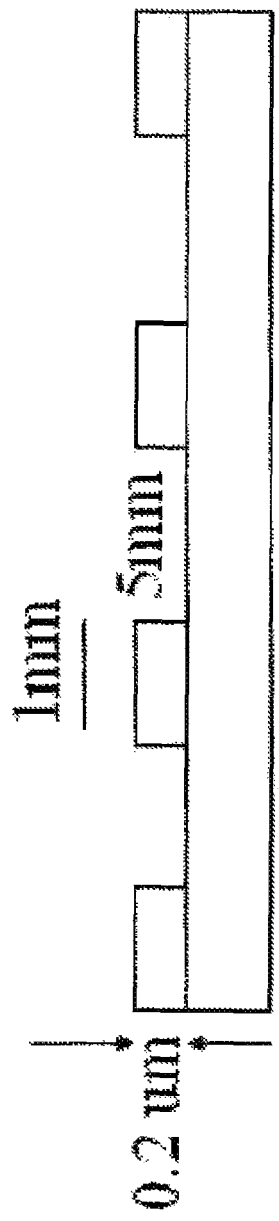

Referring to FIGS. 17A and 17B, a test surface was first fabricated from gold evaporated on a glass substrate, such that the test surface comprised 200 nm high, 1 mm wide gold steps with 5 mm separation. Nanotubes were then solubilized (e.g., as in the previous example) and deposited onto an alumina filter, whereon they formed a nanostructure-film. After washing (e.g., with water) and drying (e.g., with heat and/or air flow blow dry), this film was placed in conformal contact with a poly(dimethylsiloxane) (PDMS) stamp, which transferred the film onto the PDMS stamp. Subsequent heating of this PDMS stamp (e.g., at 80° C.) while in conformal contact with the second test surface transferred the film thereto. The PDMS stamp was made by mixing a silicone elastomer base and curing agent (e.g., in a ratio of 1:10), and curing the resulting mixture in a silicon master (e.g., patterned SU-8 on a silicon wafer).

Nanostructure-films formed using this exemplary method displayed good step-coverage, with measured sheet resistances of about 400 ohms in the area between the substrate steps (R12), and about 730 ohms in the area over a substrate step (R34). Stamping methods according to further embodiments of the present invention may comprise bringing a nanostructure-film-bearing stamp into contact with the substrate at different relative angles to form layers of nanotube film on non-flat portions of the substrate. Additionally or alternatively, the stamp may have a non-flat contour (e.g., an inverse of the non-flat substrate surface contour) and may thereby more evenly deposit nanostructure-film on the non-flat substrate surface.

Figure 18A:
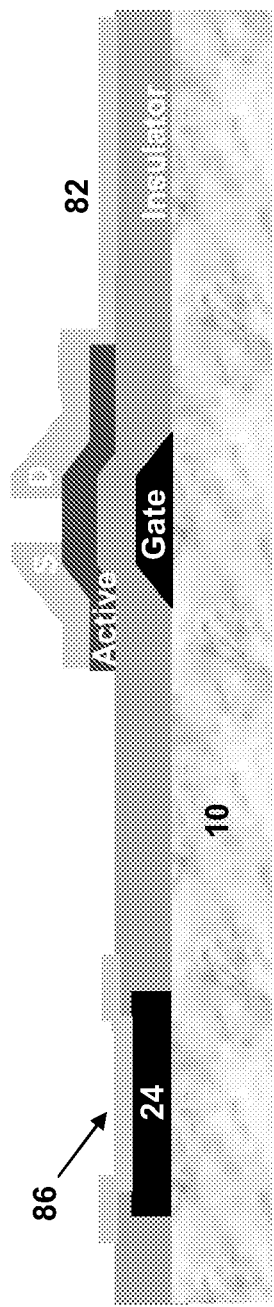
FIGS. 18A, 18B and 18C are schematic views of TFT substrates according to third and fourth preferred embodiments of the present invention, respectively (note: as above, although the drawings show only a section of the substrate, it is to be assumed that many of the elements described may be formed a plurality of times over the substrate)
Figure 18B:
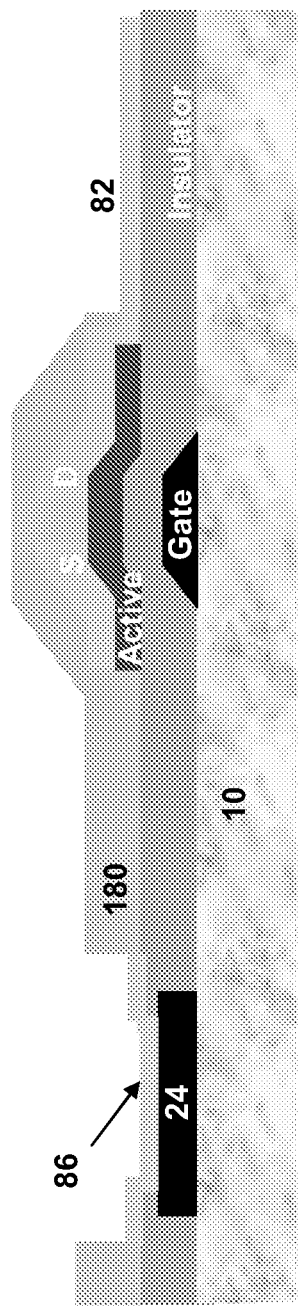
Figure 18C:
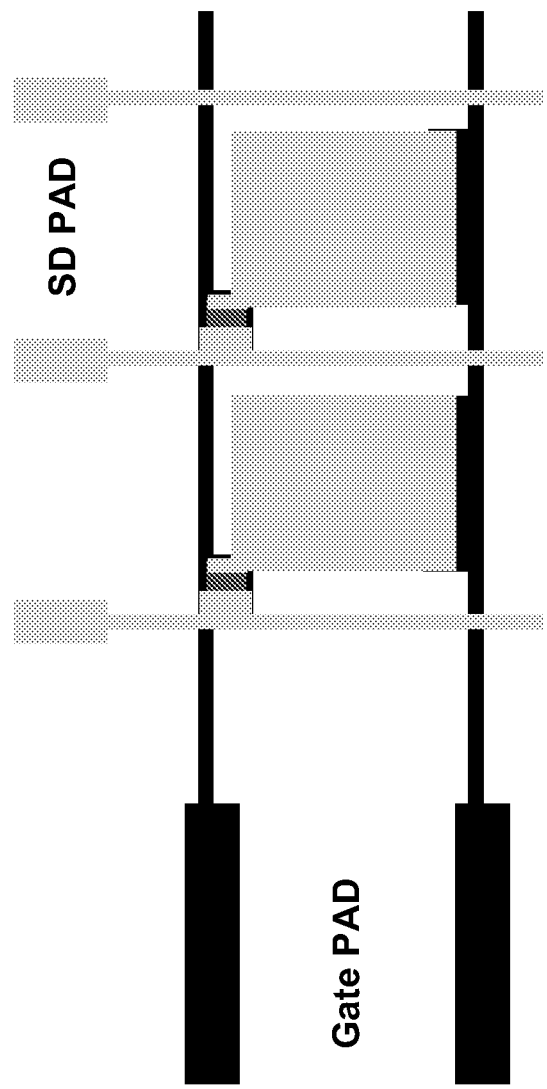

Referring to FIGS. 18A and 18B, pixel electrodes 82 and/or auxiliary pads 86 according to third and fourth preferred embodiments of the present invention may be deposited directly on an underlying gate insulating layer (insulator). In contrast to the TCOs used in the conventional art, nanostructure films can be deposited using low-impact methods (e.g., as enumerated above) that do not damage underlying gate insulating layers, and thus do not require an intermediate protection layer 70 (see also FIG. 18C and FIG. 2, for comparison).

Figure 19:
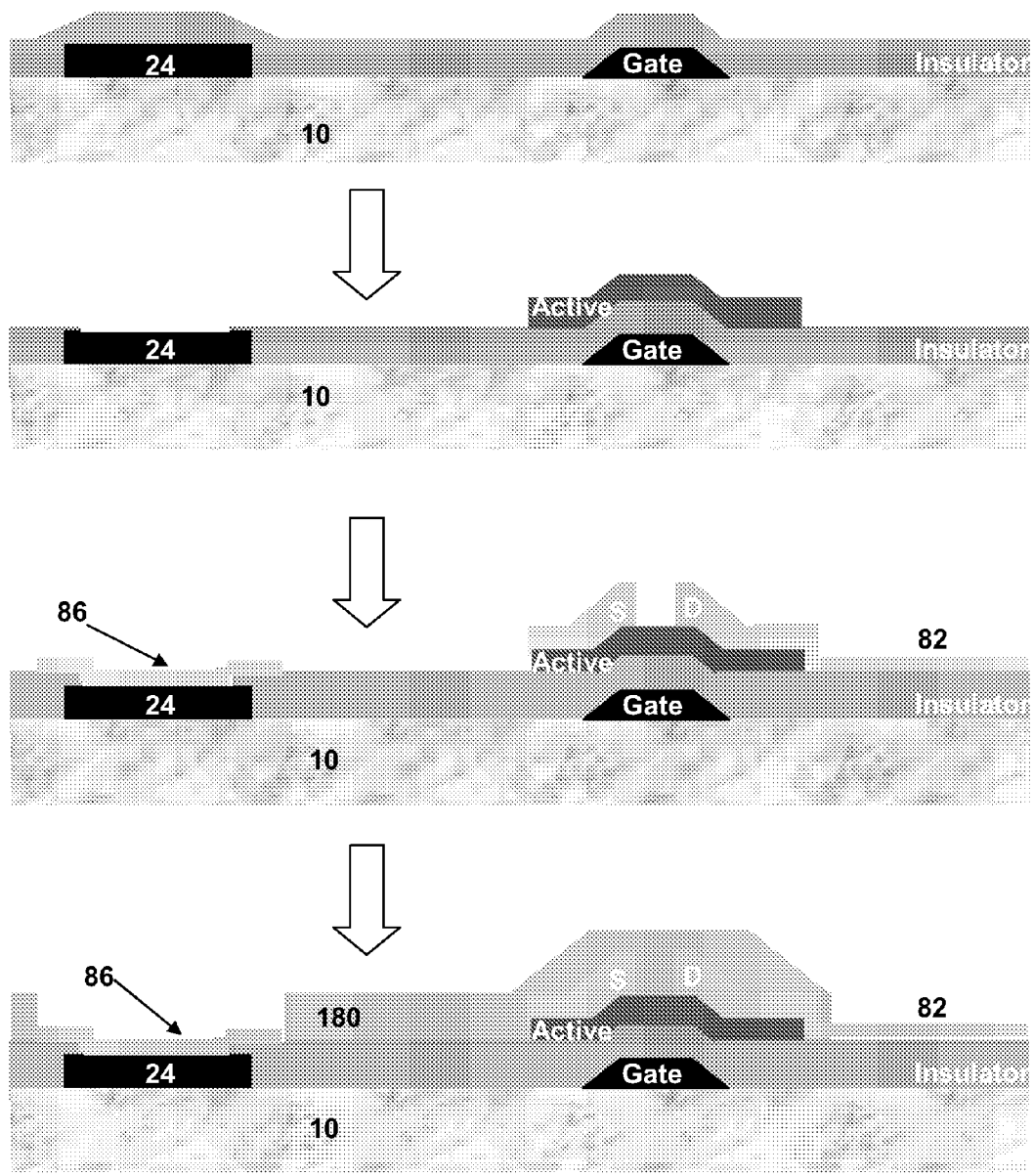
FIG. 19 shows schematic views sequentially illustrating intermediate processes in the manufacturing of a TFT substrate according to the third and fourth preferred embodiments of the present invention.

Referring to FIG. 19, a TFT substrate fabrication process according to the third and fourth preferred embodiments of the present invention may reduce the number of required mask steps, relative to the conventional art, and thereby the overall device fabrication time and cost. Specifically, the pixel electrodes 82 and/or auxiliary pads 86 may be formed in the same deposition step as at least one TFT electrode (e.g., source (S) and/or drain (D). Such a structure may be additionally advantageous in that the pixel electrode 82 may be formed from the same layer as the at least one TFT electrode, thereby reducing contact resistance therebetween. Moreover, step heights may be generally lower over the whole substrate, which can be advantageous with respect to liquid crystal alignment and step coverage (e.g., to gate pad 24).

An exemplary process flow according to the third preferred embodiment of the present invention may comprise as little as one sputtering step, one plasma-enhanced chemical vapor deposition (PECVD) step, one nanostructure-film deposition step (e.g., slot coating, baking, scrubbing and/or dry etching) and three masks (e.g., as depicted in the first three steps of the process flow of FIG. 19).

An exemplary process flow according to the fourth preferred embodiment of the present invention may comprise one sputtering step, two PECVD steps, one nanostructure-film deposition step and four masks (e.g., as depicted in the four-step process flow of FIG. 19). Although a polyimide crystal alignment layer deposited over the TFT may serve also as a passivation layer (e.g., according to the third preferred embodiment), a separate passivation layer 180 deposited over the TFT and insulator may nonetheless be desirable to protect these elements from subsequent device processing (e.g., common electrode and source-drain shorting caused by spacers). This separate passivation layer 180 may comprise, for example, nitride, silicon dioxide and/or some other insulating material.

Myriad devices may be based on nanostructure-film pixel electrodes, according to embodiments of the present invention. Examples include, but are not limited to, active matrix displays that can be used to selectively allow light transmission and therefore require at least semi-transparent pixel electrodes (e.g., LCDs). Further examples include, but are not limited to, active matrix displays that can utilize at least semi-transparent pixel electrodes to allow viewability from both front and back sides of the display (e.g., organic light emitting diode (OLED) displays). Moreover, because of nanostructure-films' potentially superior mechanical properties, the aforementioned displays can be made flexible. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some but less than 50% transmission of ambient electromagnetic radiation in relevant wavelengths are said to be "semi-transparent."

EXAMPLE

Liquid Crystal Display

Figures 20A, 20B:
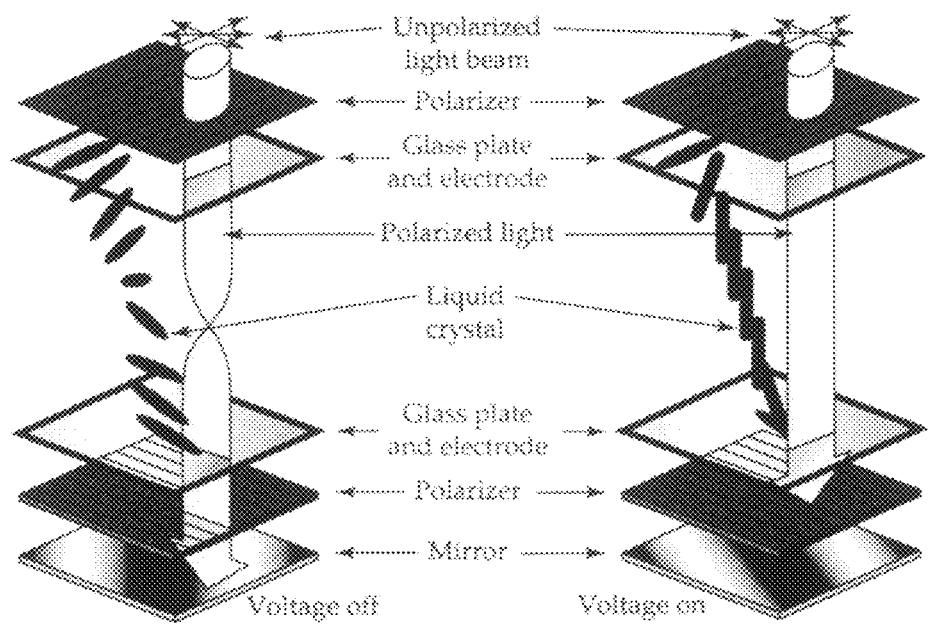
FIGS. 20A and 20B are schematic representations of liquid crystal displays (LCDs) according to embodiments of the present invention, comprising at least one nanostructure-film pixel electrode.

Referring to FIGS. 20A and 20B, nanostructure-film pixel electrodes according to embodiments of the present invention may be used in liquid crystal displays (LCDs), specifically active matrix LCDs as described above. Such devices may comprise a liquid crystal material 1830 injected between two substrates with electrodes 1810, 1850 and crystal alignment layers 1820, 1840 deposited thereon. Preferably, at least one electrode layer comprises nanostructure-film pixel electrodes.

EXAMPLE

OLED Display

Referring to FIGS. 21A and 21B, nanostructure-film pixel electrodes according to embodiments of the present invention may be used in electroluminescent (EL) devices wherein electrons and holes are separated through doping of an active layer material (e.g., to form a p-n junction as in organic light emitting diodes (OLEDs)). Preferably, such devices comprise an EL active layer 1920 (e.g., a polymer- and/or small molecule-based material) into which holes and electrons are injected from an anode 1910 and cathode 1930, respectively, wherein at least one of the anode 1910 and cathode 1930 comprises a transparent conductive nanostructure-film. Such devices may further comprise at least one buffer layer 1940, 1950 (e.g., TPD-$Si_2$, TFB, CuPc and/or $Cs_2CO_3$).

The present invention has been described above with reference to preferred features and embodiments. Those skilled in the art will recognize, however, that changes and modifications may be made in these preferred embodiments without departing from the scope of the present invention. These and various other adaptations and combinations of the embodiments disclosed are within the scope of the invention.

What is claimed is:

1. A pixel electrode, comprising:
only an interconnected network of nanotubes; wherein
the pixel electrode is electrically conductive and optically transparent,
the pixel electrode is disposed over a non-flat surface such that the pixel electrode covers at least one step of the non-flat surface, the non-flat surface being a substrate including a thin-film transistor,
the thin-film transistor includes a source electrode, a drain electrode, a gate electrode and a gate insulating layer, the gate insulating layer including a gate dielectric,
the pixel electrode makes electrical contact with at least one of the source electrode and the drain electrode,
the pixel electrode is disposed directly on the gate insulating layer, and
an area of the pixel electrode over the thin-film transistor is thicker than a pixel area of the pixel electrode.

2. The pixel electrode of claim 1,
wherein the pixel electrode is separated from one of the source electrode and the drain electrode by a protection layer, and
wherein the pixel electrode makes contact with the one of the source electrode and the drain electrode through at least one contact hole in the protection layer.

3. The pixel electrode of claim 2, wherein contact hole is at least 300 nm deep.

4. The pixel electrode of claim 1, wherein at least one of the source electrode and the drain electrode includes an interconnected network of nanotubes.

5. The pixel electrode of claim 4, wherein the pixel electrode has an optical transparency of at least 85% at 550 nm and a corresponding sheet resistance of at least 300 Ω/square.

6. A thin-film transistor substrate, comprising:
a pixel electrode; and a gate insulting layer; wherein
the pixel electrode is electrically conductive and optically transparent,
the pixel electrode is disposed over a non-flat surface of the thin-film transistor substrate such that the pixel electrode covers at least one step of the non-flat surface,
the pixel electrode includes only an interconnected network of carbon nanotubes,
the thin-film transistor substrate further includes a thin-film transistor having a source electrode, a drain electrode and a gate electrode,
the pixel electrode electrically contacts at least one of the source electrode and the drain electrode,
the gate insulating layer includes a gate dielectric,
the pixel electrode is disposed directly on the gate insulating layer, and
an area of the pixel electrode over the thin-film transistor is thicker than a pixel area of the pixel electrode.

7. The thin-film transistor substrate of claim 6, further comprising:
an auxiliary pad; wherein
the auxiliary pad includes an interconnected network of carbon nanotubes.

8. The thin-film transistor substrate of claim 6, wherein at least one of the source electrode and the drain electrode includes an interconnected network of nanotubes.

9. A thin-film transistor substrate, comprising:
a pixel electrode;
a gate insulating layer; and
an auxiliary pad including only an interconnected network of carbon nanotubes; wherein
the pixel electrode is electrically conductive and optically transparent,
the pixel electrode is deposited over a non-flat surface of the thin-film transistor substrate such that the pixel electrode covers at least one step of the non-flat surface,
the thin-film transistor substrate further includes a thin-film transistor having a source electrode, a drain electrode and a gate electrode,
the pixel electrode electrically contacts at least one of the source electrode and the drain electrode,
the gate insulating layer includes a gate dielectric,
the pixel electrode is disposed directly on the gate insulating layer, and
an area of the pixel electrode over the thin-film transistor is thicker than a pixel area of the pixel electrode.

10. The thin-film transistor substrate of claim 9, wherein the pixel electrode and at least one electrode of the thin-film transistor substrate are formed of a single layer pattern.

* * * * *